United States Patent [19]
Mercado

[11] Patent Number: 5,856,884
[45] Date of Patent: Jan. 5, 1999

[54] PROJECTION LENS SYSTEMS

[75] Inventor: Romeo I. Mercado, Fremont, Calif.

[73] Assignee: Nikon Corporation, Tokyo, Japan

[21] Appl. No.: 924,303

[22] Filed: Sep. 5, 1997

[51] Int. Cl.⁶ .................................................. G02B 9/00
[52] U.S. Cl. ........................................ 359/649; 359/754
[58] Field of Search .................................. 359/649, 650, 359/651, 754

[56] References Cited

U.S. PATENT DOCUMENTS

| | | | |
|---|---|---|---|
| 4,037,937 | 7/1977 | Minoura | 350/184 |
| 4,619,508 | 10/1986 | Shibuya et al. | 353/122 |
| 4,770,477 | 9/1988 | Shafer | 350/1.2 |
| 4,939,630 | 7/1990 | Kikuchi et al. | 362/268 |
| 4,976,525 | 12/1990 | Matsumura et al. | 350/432 |
| 5,237,367 | 8/1993 | Kudo | 355/67 |
| 5,260,832 | 11/1993 | Togino et al. | 359/679 |
| 5,392,094 | 2/1995 | Kudo | 355/67 |

FOREIGN PATENT DOCUMENTS 5-34593  10/1991  Japan.

*Primary Examiner*—Scott J. Sugarman
*Attorney, Agent, or Firm*—H. Donald Nelson

[57] ABSTRACT

Projection lens systems, which are used to transfer a pattern from a reticle onto a substrate, incorporate projection optical systems that are capable of maintaining the same, or increased performance, as the current projections lens systems, achieve excellent aberration correction, and which have high numerical apertures.

25 Claims, 15 Drawing Sheets

PROJECTION LENS SYSTEMS

1. FIELD OF THE INVENTION

This invention relates to projection lens systems for exposure lithography in which a pattern on a mask or reticle is transferred onto a substrate such as a semiconductor wafer or glass plate. More particularly, the present invention is directed to projection lens systems that have high resolution, high numerical apertures, and wide fields of view. In addition, the projection lens systems are substantially doubly telecentric and diffraction limited. Such projection lens systems provide optimal lithography for I-line, g-line, and excimer laser applications.

2. BACKGROUND OF THE INVENTION

In semiconductor device manufacturing, projection optical systems are used to transfer integrated circuit (IC) patterns such as large scale integrated (LSI) circuit patterns from a reticle onto a wafer or semiconductor substrate upon which the semiconductor device is to be formed. Because of the difference in the relative sizes of the reticle, which is typically larger than the resulting semiconductor device, projection optical systems must be reduction projection optical systems. A reticle is also known as a mask and the resulting semiconductor device is also known as a die or a semiconductor chip.

Modern integrated circuits are becoming more integrated; that is, more and more functions are being designed into circuits to be manufactured on a single die. However, to maintain or improve the performance and speed of the semiconductor devices being manufactured there is a major effort not to allow the die to grow in size. In order to maintain the same or a reduced die size, the reduction projection optical system for the manufacture of the more complex semiconductor devices must have a wider exposure area, higher resolution, and a higher numerical aperture.

A projection optical system for use in a projection exposure system requires very precise preparation of the glass or quartz materials that are used in the projection optical system. In addition, the projection optical system must be very precisely assembled into the projection exposure system.

The manufacture of current semiconductor integrated circuits typically involves the use of a stepper apparatus or a scanning apparatus. In a stepper apparatus, the reticle or mask is illuminated and the light transmitted through the circuit pattern on the reticle is imaged onto a portion of the photosensitive substrate by the projection optical system. The stepper apparatus then moves the wafer and another portion of the photosensitive substrate is exposed. This process is repeated until the entire photosensitive substrate has been exposed. The photosensitive substrate could be a wafer, or the like, on which a photoresist material has been applied. In a scanning apparatus, the pattern on the reticle is scanned over the surface of the wafer.

The traditional illumination sources utilized in semiconductor manufacturing have been the deuterium lamp and the xenon-mercury arc lamp. The I-line from the xenonmercury arc lamp has a wavelength of 365 nanometers and has been one of the principal illumination sources used in semiconductor manufacturing. In order to attain higher resolution, shorter wavelength optical systems have been developed. These shorter wavelength optical systems use an illumination source such as the KrF excimer laser having a wavelength of 248 nanometers or the ArF excimer having a wavelength of 193 nanometers. In projection optical systems using an excimer laser as an illumination source, the usable lens materials are limited to materials such as quartz and fluorite which can transmit the shorter wavelengths. However, the use of quartz and fluorite materials, which are very expensive, make the cost of these systems very high.

Generally, to accurately transfer a minute pattern from the reticle to the photosensitive substrate by exposure in a projection optical system, the resolving power and depth of focus (DOF) of the projection optical system are important factors. In projection optical systems, the resolving power can generally be improved by increasing the numerical aperture. However, there are trade-offs that must be considered when the numerical aperture is increased. One such tradeoff, for example, is that the depth of focus decreases with an increase in numerical aperture. The relationship between the depth of focus (DOF) and numerical aperture (NA) is $DOF = \pm \lambda/(NA)^2$ where $\lambda$ is the wavelength of the illuminating light.

Referring to FIG. 1A there is shown an off-axis point A on the reticle 102 with traces $A_1$ and $A_2$ representing light rays originating from point A. The ray traces that originate at point A and pass through the pupil defined by the aperture stop AS 35 contribute to form a point image at the point A' on the wafer surface. The ray of light $A_1$ passing through the center point C on the optical axis $A_X$ in the pupil is called a chief ray or principal ray. The chief ray or principal ray is parallel to the optical axis $A_X$ in the spaces on the object space side and the image space side in the case of a projection optical system in which both sides are telecentric. A ray from an axial object point $A_0$ on the reticle that passes through the edge of the pupil or aperture stop is called the marginal ray. The sine of the angle $\theta$ between the marginal ray and the optical axis at the image plane $A_0'$ corresponds to the numerical aperture NAw on the wafer side of such a projection optical system and therefore the NA for the system is expressed as $NA = N \sin \theta$, where N is the refractive index of image space medium that is equal to unity for air. The numerical aperture of such a projection optical system is generally represented as the wafer side value.

To enhance the resolving power, the numerical aperture NA can be increased by making the diameter of the pupil larger. However, before the pupil can be made larger, other parameters of the optical system must be adjusted in order to maintain the performance. As can be appreciated by those of ordinary skill in the optical art, merely increasing the pupil may degrade other optical performance factors such as aberration correction.

Accordingly, there is a need for projection lens systems that have high numerical apertures that are capable of maintaining or increasing the required high level of performance.

3. SUMMARY OF THE INVENTION

A projection lens system in accordance with the present invention solves the above and other problems associated with conventional projection optical systems by maintaining or increasing the performance in comparison to existing optical lens systems with high numerical apertures.

The above and other objects and advantages of the present invention are attained through projection lens systems according to several embodiments of the present invention in which patterns on a reticle are transferred onto a substrate. In each of the several embodiments, the projection lens system includes an illumination system to uniformly illuminate the reticle with illumination having a wavelength $\lambda$. A reticle stage supports the reticle and a substrate stage supports the substrate. A projection lens system having four groups of lens element is disposed between the reticle and the substrate. The third group of lens elements includes a subgroup of lens elements having an overall negative refractive power and includes at least two lens elements each having a negative refractive power. The fourth group of lens elements has a subgroup of lens elements that includes three lens elements, the first is a lens element having a positive refractive power, the second is a lens element having a negative refractive power, and the third is a lens element having a positive refractive power. The fourth group of lens elements also has a second subgroup of three lens elements, the first is a lens element having a positive refractive power, the second is a lens element having a negative refractive power, and the third is a lens element having a positive refractive power. An aperture stop is disposed between the subgroup of lens elements in the third group of lens elements and the second subgroup of lens elements in the fourth group of lens elements. The projection lens system satisfies the conditions:

$$0.073 < |f_{G2}/L| < 0.183 \text{ and } 0.228 < |f_{G3}/L| < 0.900,$$

where $f_{G2}$ is the focal length of the second group of lens element, $f_{G3}$ is the focal length of the third group of lens elements and L is the axial distance between the object plane and the image plane.

The second group of lens elements G2 has a subgroup of lens elements, $G2_S$, having an overall negative refractive power. The second group of lens elements, G2, also includes a lens element having a positive refractive power.

The subgroup of lens elements $G2_S$ in the second group of lens elements is disposed approximately at the position at which the chief ray, emanating from the furthest off-axis point on the reticle, has the largest chief ray angle with respect to the optical axis.

The subgroup of lens elements $G3_S$ in the third group of lens elements G3 is disposed approximately at the position at which a marginal ray emanating from the reticle is closest to the optical axis during the projection of the marginal ray through the third group of lens elements G3.

The subgroup of lens elements $G4_{S2}$ is disposed at the position at which a marginal ray emanating from the reticle is furthest from the optical axis during the projection of the marginal ray through the projection lens systems.

The projection lens system satisfies the condition: $|f_{G4S2}/f_{G4}| < 4.211$, where $f_{G4S2}$ is the focal length of the second subgroup of lens elements in the fourth group of lens elements and $f_{G4}$ is the focal length of the fourth group of lens elements.

The subgroup of lens elements having a negative refractive power in the second group of lens elements includes a lens element having a negative refractive power disposed closest to the object plane and having a concave surface facing the image plane and a lens element having a negative refractive power disposed closest to the image plane and having a concave surface facing the object plane.

The subgroup of lens elements having a negative refractive power in the third group of lens elements includes a lens element disposed closest to the object plane and having a concave surface facing the image plane and a lens element disposed closest to the image plane and having a concave surface facing the object plane.

The subgroup of lens elements having a negative refractive power in the second group of lens elements and the subgroup of lens elements having a negative refractive power in the third group of lens elements are disposed approximately symmetrically with respect to a plane which is perpendicular to an optical axis of the projection lens system wherein the plane is situated between the second group of lens elements and the third group of lens elements.

The second subgroup of lens elements in the fourth group of lens elements includes, in order from the object plane side to the image plane side, a lens element having a positive refractive power with a stronger convex surface facing the object plane, a lens element having a negative refractive power, and a lens element having a positive refractive power with a stronger convex surface facing the object plane.

The projection lens system satisfies the condition $1.169 < |f_{G1}/f_{G4}| < 2.180$, where $f_{G1}$ is the focal length of the first group of lens elements and $f_{G4}$ is the focal length of the fourth group of lens elements.

The projection lens system satisfies the conditions: beam expansion ratio<5.12 and m<0.29 where m is the angular magnification and the beam expansion ratio and the angular magnification are measured from the first group of lens elements to the third group of lens elements.

These and other advantages of the present invention will become more apparent upon a reading of the detailed description of the preferred embodiments which follows, when considered in conjunction with the drawings of which the following is a brief description. It should be clear that the drawings are merely illustrative of the currently preferred embodiments of the present invention, and that the invention is in no way limited to the illustrated embodiments. The present invention is best defined by the claims appended to this specification.

4. BRIEF DESCRIPTION OF THE DRAWINGS

The accompanying drawings incorporated in and forming a part of the specification, illustrate the present invention, and together with the detailed description below serve to explain the principles of the invention. In the drawings.

5. DESCRIPTIONS OF THE PREFERRED EMBODIMENTS

Figure 1A:
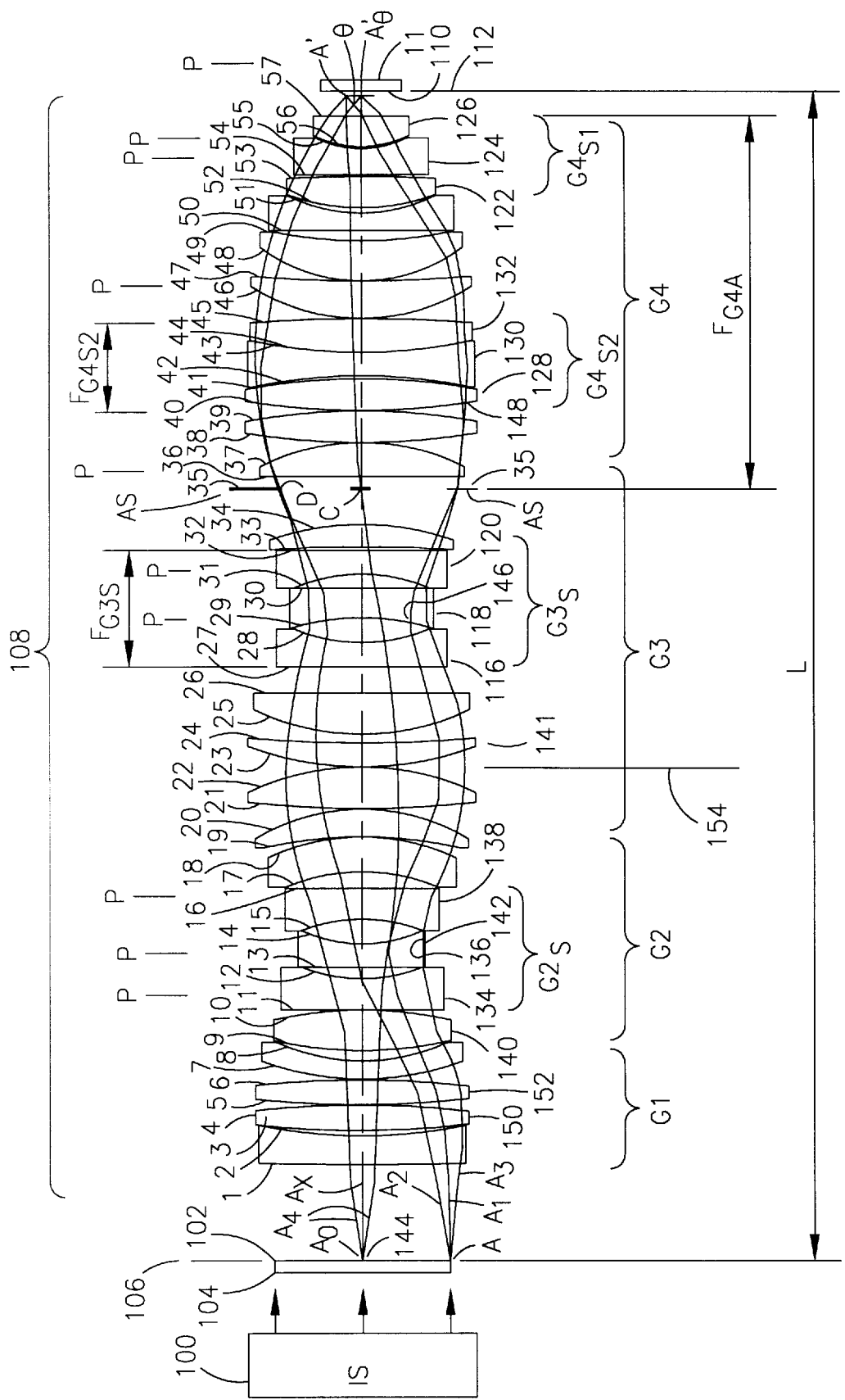
FIG. 1A is a schematic diagram of the projection lens system according to a first embodiment of the present invention.

The following detailed description is of the presently preferred embodiments of the present invention. It is to be understood that while the detailed description is given utilizing the drawings briefly described above, the invention is not limited to the illustrated embodiments. In the detailed description, like reference numbers refer to like elements.

Referring now to the Figures, the embodiments of the present invention will now be described. According to standard practice in the optical art, drawings of optical lens systems, such as those shown in the Figures, have the object space, defined as all the space from the first element or surface of a system towards the object and beyond, shown on the left in the drawing. Similarly, the image space, defined as all the space from the last element or surface of a system towards the image and beyond, is shown on the right in the drawing.

Referring to FIG. 1A, a first embodiment of a projection lens system in accordance with the present invention is shown. In general, a projection lens system such as the projection lens system shown in FIG. 1A includes an illumination system (IS) 100, a reticle 102 mounted on a reticle stage 104, located at the object or reticle plane 106, a projection lens system 108, a substrate 110, located at the image or substrate plane 112, and mounted on a substrate stage 114. As can be appreciated by a person of ordinary skill in the exposure lithography art, the above components are mounted in a stable secure structure which is not shown in this or any of the succeeding figures. The required mounting structure is well known in the exposure lithography art and will not be discussed.

The illumination system 100 includes a source of illumination. Examples of illumination systems may be found in, for example, U.S. Pat. Nos. Re 34,634, 4,918,583, 5,245,384, 5,335,044, and 5,420,417. Each of these patents is incorporated herein by reference in its entirety. An example of an exposure apparatus using an excimer laser source may be found in, for example, U.S. Pat. No. 4,952,945 which is incorporated herein by reference in its entirety. A projection exposure apparatus utilizing the output of an excimer laser to transfer the pattern of a reticle onto a semiconductor substrate is known from U.S. Pat. No. 4,458,994 which is incorporated herein by reference in its entirety.

Referring again to FIG. 1A, the projection lens system 108, viewed from the object side, in order of succession, includes a first group of lens elements G1, a second group of lens elements G2, a third group of lens elements G3, and a fourth group of lens elements G4. It is noted that in FIG. 1A there are "distances" indicated, for example, $f_{G4A}$. It is to be understood that these representations do not indicate the numerical values of the focal lengths. These representations only indicate the lens elements that are included in the calculations of focal length.

The third group of lens elements G3 includes a subgroup of lens elements $G3_S$ having an overall negative refractive power, the subgroup of lens elements $G3_S$ having three lens elements 116, 118, and 120, each having a negative refractive power.

The fourth group of lens elements G4 has a first subgroup of lens elements $G4_{S1}$ with a lens element 122 having a positive refractive power, a lens element 124 having a negative refractive power, and a lens element 126 having a positive refractive power. The fourth group of lens elements G4 also has a second subgroup of lens elements $G4_{S2}$ including a lens element 128 having a positive refractive power, a lens element 130 having a negative refractive power, and a lens element 132 having a positive refractive power. An aperture stop AS 35 is disposed between the subgroup $G3_S$ and the subgroup $G4_{S2}$.

The projection lens system 108 satisfies the conditions: $0.073 < |f_{G2}/L| < 0.183$, and $0.228 < |f_{G3}/L| < 0.900$, where $f_{G2}$ is the focal length of the second group of lens elements, $f_{G3}$ is the focal length of the third group of lens elements, and L is the axial distance between the object plane and the image plane. If the above ratios are outside the ranges, it becomes not only difficult to correct the aberrations individually but to balance the aberration correction of the field dependent aberrations (image field curvature, astigmatism, coma, and distortion) together with spherical aberration which is dependent upon the NA of the projection system. The above conditions also affect the uniformity and balance of the maximum diameters of the lens groups in the optical projection system. Specifically, if the ratio $|f_{G2}/L|$ is less than 0.073 (holding the ratio $|f_{G3}/L|$ fixed) the beam expansion ratio decreases resulting in a more uniformly shaped lens system, however, the angular magnification increases making it more difficult to correct field dependent aberrations although it is easier to correct spherical aberration. If the ratio $|f_{G2}/L|$ is greater than 0.183 (holding the ratio $|f_{G3}/L|$ fixed) the beam expansion ratio increases resulting in an irregular shaped lens system and the angular magnification decreases making it more difficult to correct for spherical aberration although it is easier to correct field dependent aberrations. If the ratio $|f_{G3}/L|$ is less than 0.228 (holding the ratio $|f_{G2}/L|$ fixed) the beam expansion ratio increases resulting in an irregular shaped lens system and the angular magnification decreases making it more difficult to correct for spherical aberration although it is easier to correct field dependent. If the ratio $|f_{G3}/L|$ is greater than 0.900 (holding the ratio $|f_{G2}/L|$ fixed) the beam expansion ratio decreases resulting in a more uniformly shaped lens system, however, the angular magnification increases making it more difficult to correct field dependent aberrations although it is easier to correct spherical aberration.

The second group of lens elements G2 includes a subgroup of lens elements $G2_S$ having an overall negative refractive power and includes three lens elements 134, 136, and 138 each having a negative refractive power. The second group of lens elements G2 also includes a lens element 140 having a positive refractive power and having a convex lens surface 10 facing the image plane 112.

The lens subgroup $G2_S$ in conjunction with the lens subgroup $G3_S$ minimizes the Petzval curvature of the overall projection lens system.

The subgroup of lens elements G2$_S$ is disposed approximately at the position in the projection lens system 108 at which the ray trace A$_3$ is closest, indicated at 142, to the optical axis A$_X$ of the projection lens system. The trace A$_3$ represents a light ray emanating from a point on the reticle furthest from the optical axis and at an angle corresponding to the largest angle of view that can be projected through the projection lens system.

The subgroup of lens elements G3$_S$ is disposed approximately at the position in the projection lens system 108 at which a marginal ray A$_4$ emanating from a point on the reticle at the optical axis, indicated at 144, is closest, indicated at 146, to the optical axis A$_X$ while in the third group of lens elements.

The subgroup of lens elements G4$_{S2}$ is disposed at the position at which a marginal ray A$_4$ emanating from a point on the reticle at the optical axis 144 is furthest, indicated at 148, from the optical axis.

The projection lens system 108 satisfies the condition: $|f_{G4S2}/f_{G4}|<4.211$, where $f_{G4S2}$ is the focal length of the subgroup of lens elements G4$_{S2}$ in the fourth group of lens elements G4 and $f_{G4}$ is the focal length of the fourth group of lens elements G4. This condition provides a means of controlling the maximum lens diameter of the fourth group of lens elements G4 and therefore to make it easier to correct and balance the aberrations of the overall projection lens system. Specifically, if the ratio $|f_{G4S2}/f_{G4}|$ is above 4.211, the diameter of the lens elements in the fourth group of lens elements G4 becomes too large, too bulky, too hard to package, and too costly to manufacture.

The first group of lens elements G1 includes two lens elements 150 and 152 each having a positive refractive power.

The lens element 134 in the subgroup of lens elements G2$_S$ in the second group of lens elements G2 has a concave surface 12 facing the image plane 112. The lens element 138 in the subgroup of lens elements G2$_S$ in the second group of lens elements G2 has a concave surface 15 facing the object plane 106.

The lens element 116 in the subgroup of lens elements G3$_S$ in the third group of lens elements G3 has a concave surface 28 facing the image plane 112. The lens element 120 in the subgroup of lens elements G3$_S$ in the third group of lens elements G3 has a concave surface 31 facing the object plane 106.

The lens element 116 in the subgroup of lens elements G3$_S$ has a shape factor $q_{AF2N}=-1.121$.

Note that the shape factor q of a lens is expressed by: $q=(r_2+r_1)/(r_2-r_1)$ where $r_1$ is the radius of curvature of the surface on the object side of the lens and $r_2$ is the radius of curvature of the surface on the image side of the lens.

The subgroup of lens elements G2$_S$ and the subgroup of lens elements G3$_S$ are approximately symmetrically disposed on either side of a plane, indicated at 154, that is perpendicular to the optical axis A$_X$ of the projection lens system and is situated between the second group of lens elements G2 and the third group of lens elements G3.

The subgroup of lens elements G4$_{S2}$ in the fourth group of lens elements G4 includes a lens element 128 having a positive refractive power with a stronger convex surface 40 facing the object plane 106, a lens element 130 having a negative refractive power with a stronger concave surface 43 facing the image plane 112, and a lens element 132 having a positive refractive power with a stronger convex surface 44 facing the object plane 106. The lens element 128 has a shape factor $q_{FOCE1P1'}=-0.5070$, the lens element 130 has a shape factor $q_{FOC21N}=-0.3229$ and the lens element 132 has a shape factor $q_{FOC21P2}=1.0$.

The focal length of the first group of lens elements G1 and the focal length of the fourth group of lens elements satisfy the condition: $1.169<|f_{G1}/f_{G4}|<2.180$. If the ratio is under the lower limit or above the upper limit, the length of the projection lens system becomes too large, causing structural support problems.

The projection lens system 108 has a beam expansion ratio (BER) that satisfies the following condition: BER<5.12, where the beam expansion ratio is the ratio of the distance from the optical axis of the marginal ray A$_4$ as it leaves the first group of lens elements to the distance from the optical axis of the marginal ray A$_4$ as it leaves the third group of lens elements. The angular magnification m is the reciprocal of the beam expansion ratio and satisfies the condition: m<0.29. If the beam expansion ratio is greater than 5.12 or if the angular magnification is greater than 0.29, the diameter of the lens elements in the third and fourth groups of lens elements must be large to accommodate the wide beam. This causes the expense of the lens system to increase and causes the weight of the lens system to increase.

The projection lens system 108 has ten plano lens surfaces: 11, 13, 16, 30, 32, 36, 45, 53, 54, and 57.

Figure 1B:
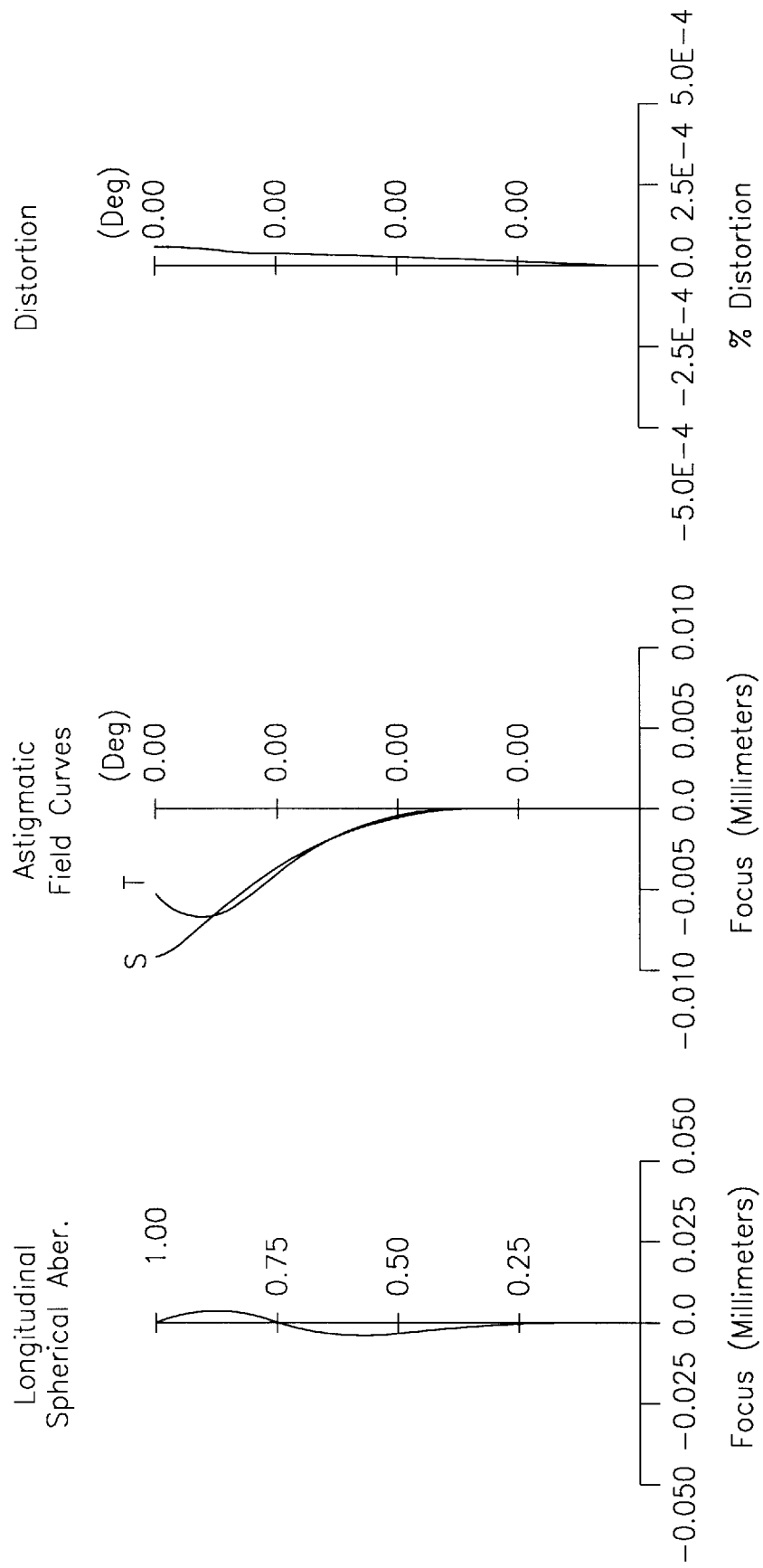
FIG. 1B shows the longitudinal spherical aberration, the astigmatic field curves, and the distortion of the projection lens system shown in FIG. 1A.

FIG. 1B shows the longitudinal spherical aberration, the astigmatic field curves, and the distortion of the projection lens system of the first embodiment shown in FIG. 1A.

Figure 1C:
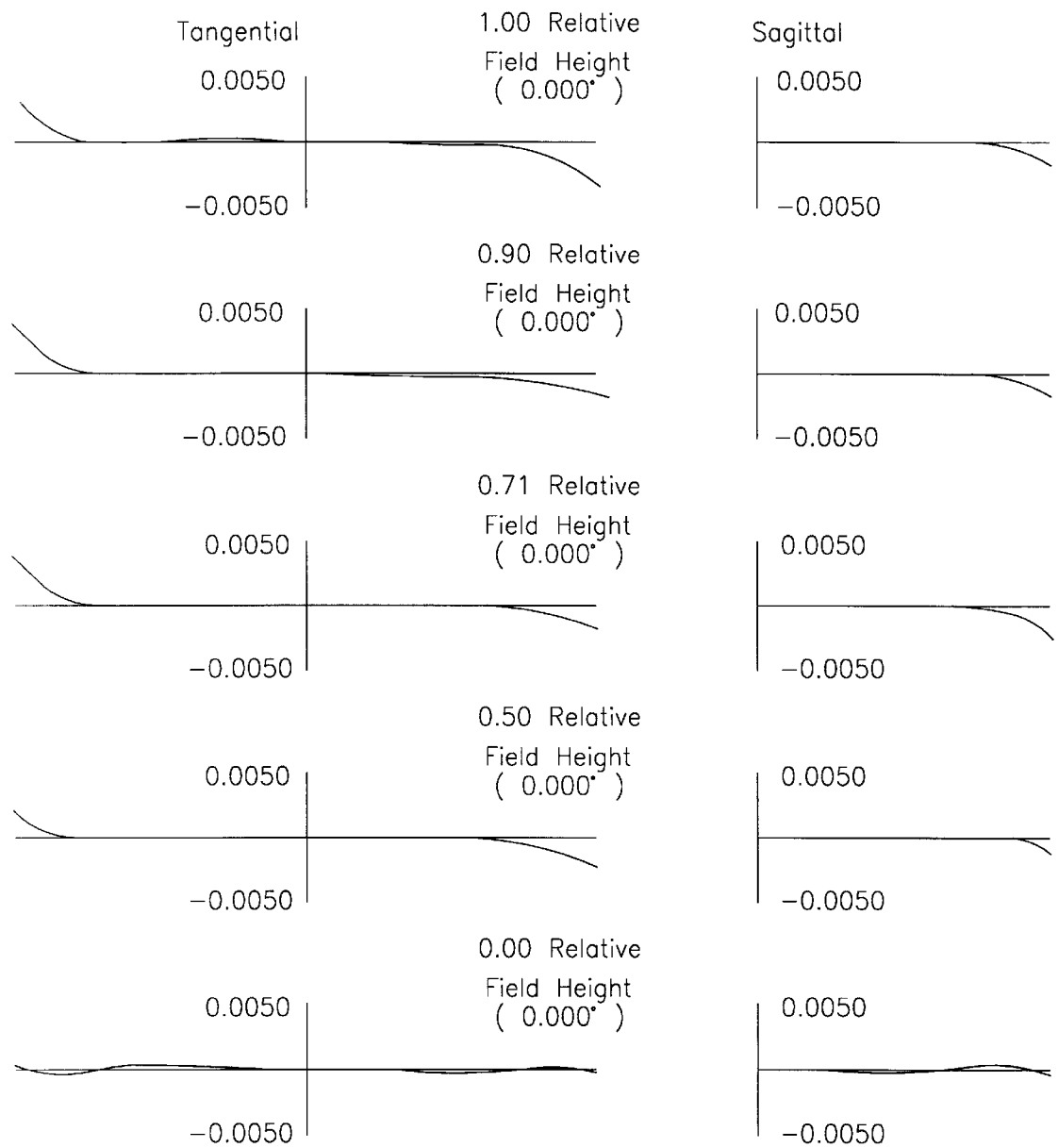
FIG. 1C shows the ray aberrations of the projection lens system shown n FIG. 1A for varying relative field heights all at wavelength of 365 nanometers.

FIG. 1C shows the ray aberrations of the projection lens system 108 of the first embodiment shown in FIG. 1A for varying field heights at a wavelength of 365 nanometers.

Table 1 below shows the values of specifications for the above first embodiment. The numbers in the left end column indicate the order of optical surfaces from the object (reticle) side to the image (substrate) side, the radius of curvature of the lens surface is given in millimeters (a positive radius indicates the center of curvature is towards the right or image side and a negative radius indicates the center of curvature is towards the left or reticle side), the axial distance in millimeters is the distance from the lens surface being described to the next lens surface. The index of refraction of the optical material is given in the rightmost column.

TABLE 1

Object plane to first optical surface = 89.000045
Last optical surface to image plane = 19.499948
$f_{G1}$ = 335.94 mm $f_{G2}$ = -129.620 mm $f_{G3}$ = 274.335 mm $f_{G4}$ = 154.176 mm $f_{G4A}$ = 141.63 mm $f_{N1}$ = -90.517 mm $f_{G2S}$ = -56.787 mm $f_{G3S}$ = -60.88 mm $f_{G4S2}$ = 649.02 mm $q_{AF2N}$ = -1.121
$q_{FOCE1P1}$ = -.5070 $q_{FOC21N}$ = -.3229 $q_{FOC21P2}$ = 1.0 L = 1200 mm
F = 723.8873 mm NA = 0.60 5× reduction F/L = 0.603 m = 0.196
field size on wafer = 22.06 × 22.06 or 31.2 mm dia.

| Surface number | Radius of curvature (mm) | axial distance | Refractive index |
|---|---|---|---|
| OBJ | INFINITY | 89.000045 | |
| 1 | 1144.75850 | 27.410849 | 1.612652 |
| 2 | 271.25530 | 10.984919 | |
| 3 | 600.62206 | 28.621843 | 1.615481 |
| 4 | -458.31070 | 0.500000 | |
| 5 | 802.26191 | 26.586853 | 1.615481 |
| 6 | -500.79596 | 0.500000 | |
| 7 | 137.46683 | 27.212316 | 1.615481 |
| 8 | 128.42807 | 18.422219 | |
| 9 | 304.59830 | 48.320418 | 1.488581 |

TABLE 1-continued

Object plane to first optical surface = 89.000045
Last optical surface to image plane = 19.499948
$f_{G1}$ = 335.94 mm $f_{G2}$ = -129.620 mm $f_{G3}$ = 274.335 mm $f_{G4}$ = 154.176
mm $f_{G4A}$ = 141.63 mm $f_{N1}$ = -90.517 mm $f_{G2S}$ = -56.787 mm
$f_{G3S}$ = -60.88 mm $f_{G4S2}$ = 649.02 mm $q_{AF2N}$ = -1.121
$q_{FOCE1P1}$ = -.5070 $q_{FOC21N}$ = -.3229 $q_{FOC21P2}$ = 1.0 L = 1200 mm
F = 723.8873 mm NA = 0.60 5× reduction F/L = 0.603 m = 0.196
field size on wafer = 22.06 × 22.06 or 31.2 mm dia.

| Surface number | Radius of curvature (mm) | axial distance | Refractive index |
|---|---|---|---|
| 10 | -307.99411 | 0.500000 | |
| 11 | INFINITY | 36.037927 | 1.615481 |
| 12 | 112.34253 | 16.695090 | |
| 13 | INFINITY | 18.000000 | 1.612652 |
| 14 | 152.85430 | 26.508704 | |
| 15 | -115.84894 | 34.815296 | 1.612652 |
| 16 | INFINITY | 16.539737 | |
| 17 | -182.51423 | 27.991098 | 1.612652 |
| 18 | -165.54155 | 0.500000 | |
| 19 | -360.03006 | 19.630299 | 1.615481 |
| 20 | -245.77406 | 0.500000 | |
| 21 | 824.17251 | 45.272308 | 1.615481 |
| 22 | -229.82030 | 0.500000 | |
| 23 | 233.88990 | 28.000523 | 1.615481 |
| 24 | 596.10936 | 15.965497 | |
| 25 | 231.00726 | 36.707058 | 1.612652 |
| 26 | 1081.78053 | 34.338760 | |
| 27 | 2114.89816 | 31.969716 | 1.612652 |
| 28 | 120.56227 | 29.239386 | |
| 29 | -151.35103 | 25.461456 | 1.612652 |
| 30 | INFINITY | 17.776209 | |
| 31 | -125.38009 | 26.888320 | 1.612652 |
| 32 | INFINITY | 4.828070 | |
| 33 | -684.88593 | 30.546295 | 1.488581 |
| 34 | -163.57141 | 18.000000 | |
| 35 (AS) | INFINITY | 18.000000 | |
| 36 | INFINITY | 28.453016 | 1.615481 |
| 37 | -314.79828 | 0.500000 | |
| 38 | 579.45101 | 33.296714 | 1.615481 |
| 39 | -516.16630 | 0.500000 | |
| 40 | 310.62515 | 37.078372 | 1.615481 |
| 41 | -949.51070 | 6.479626 | |
| 42 | -474.79775 | 18.000000 | 1.612652 |
| 43 | 243.02728 | 0.500000 | |
| 44 | 229.41587 | 35.370733 | 1.615481 |
| 45 | INFINITY | 0.500000 | |
| 46 | 173.10205 | 35.489139 | 1.488581 |
| 47 | 899.47206 | 0.500000 | |
| 48 | 115.90429 | 33.487865 | 1.488581 |
| 49 | 279.51689 | 4.712235 | |
| 50 | 496.73061 | 18.000000 | 1.612652 |
| 51 | 76.07079 | 7.772481 | |
| 52 | 103.10498 | 27.164383 | 1.488581 |
| 53 | INFINITY | 3.991213 | |
| 54 | INFINITY | 27.634734 | 1.612652 |
| 55 | 98.69663 | 0.500000 | |
| 56 | 67.53524 | 21.798277 | 1.612252 |
| 57 | INFINITY | 19.499948 | |
| IMG | INFINITY | 0.000000 | |

Figure 2A:
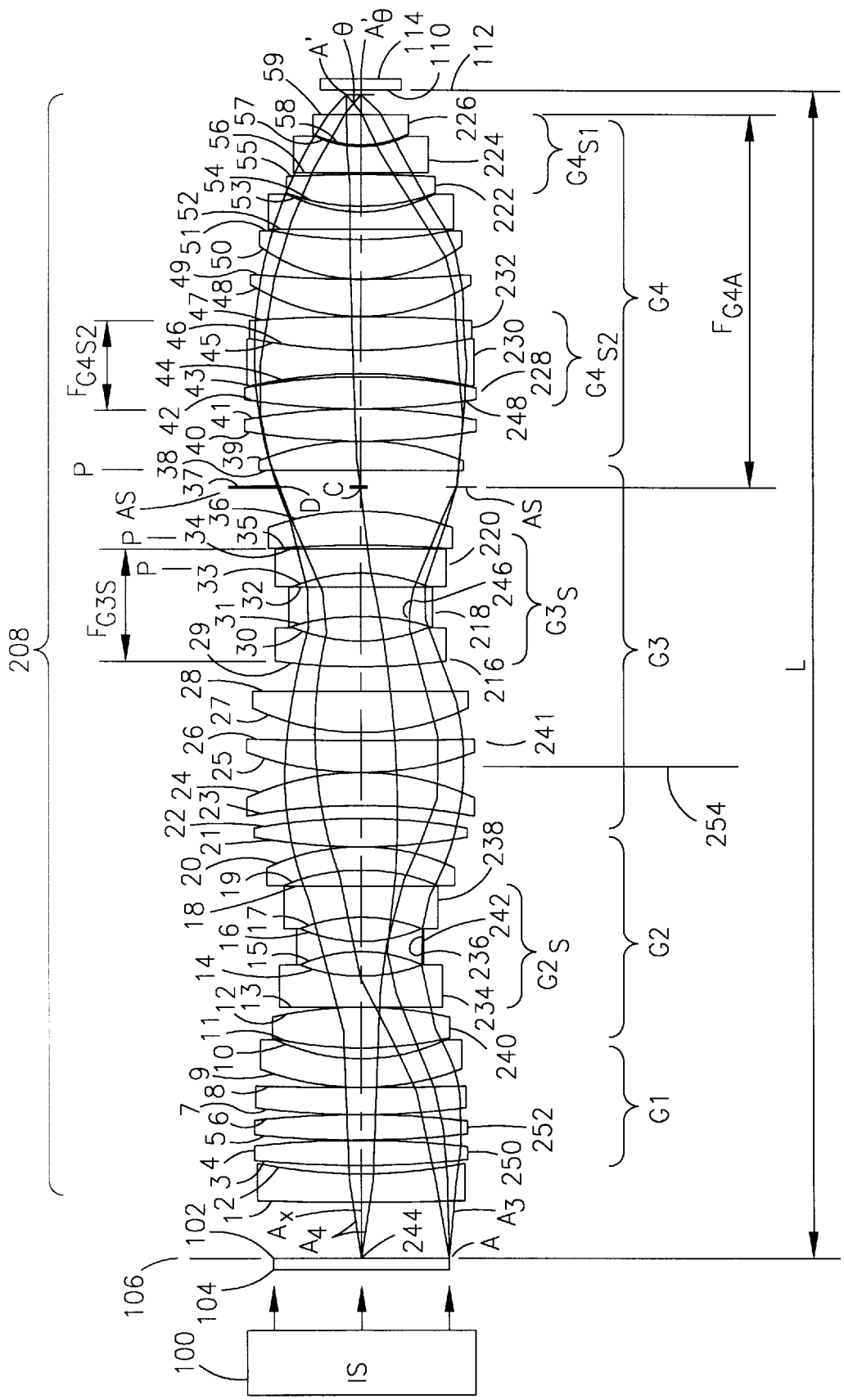
FIG. 2A is a schematic diagram of the projection lens system according to a second embodiment of the present invention.

Referring to FIG. 2A, the projection lens system 208, viewed from the object side, in order of succession, includes a first group of lens elements G1, a second group of lens elements G2, a third group of lens elements G3, and a fourth group of lens elements G4. It is noted that in FIG. 2A there are "distances" indicated, for example, $f_{G4A}$. It is to be understood that these representations do not indicate the focal lengths. These representations only indicate the lens elements that are included in the calculations of focal length.

The third group of lens elements G3 includes a subgroup of lens elements $G3_S$ having an overall negative refractive power, the subgroup of lens elements $G3_S$ having three lens elements 216, 218, and 220, each having a negative refractive power.

The fourth group of lens elements G4 has a first subgroup of lens elements $G4_{S1}$ with a lens element 222 having a positive refractive power, a lens element 224 having a negative refractive power, and a lens element 226 having a positive refractive power. The fourth group of lens elements G4 also has a second subgroup of lens elements $G4_{S2}$ including a lens element 228 having a positive refractive power, a lens element 230 having a negative refractive power, and a lens element 232 having a positive refractive power. An aperture stop AS 37 is disposed between the subgroup $G3_S$ and the subgroup $G4_{S2}$.

The projection lens system 208 satisfies the conditions: $0.073<|f_{G2}/L|<0.183$, and $0.228<|f_{G3}/L|<0.900$, where $f_{G2}$ is the focal length of the second group of lens elements, $f_{G3}$ is the focal length of the third group of lens elements, and L is the axial distance between the object plane and the image plane. If the above ratios are outside the ranges, it becomes not only difficult to correct the aberrations individually but to balance the aberration correction of the field dependent aberrations (image field curvature, astigmatism, coma, and distortion) together with spherical aberration which is dependent upon the NA of the projection system. The above conditions also affect the uniformity and balance of the maximum diameters of the lens groups in the optical projection system. Specifically, if the ratio $|f_{G2}/L|$ is less than 0.073 (holding the ratio $|f_{G3}/L|$ fixed) the beam expansion ratio decreases resulting in a more uniformly shaped lens system, however, the angular magnification increases making it more difficult to correct field dependent aberrations although it is easier to correct spherical aberration. If the ratio $|f_{G2}/L|$ is greater than 0.183 (holding the ratio $|f_{G3}/L|$ fixed) the beam expansion ratio increases resulting in an irregular shaped lens system and the angular magnification decreases making it more difficult to correct for spherical aberration although it is easier to correct field dependent aberrations. If the ratio $|f_{G3}/L|$ is less than 0.228 (holding the ratio $|f_{G2}/L|$ fixed) the beam expansion ratio increases resulting in an irregular shaped lens system and the angular magnification decreases making it more difficult to correct for spherical aberration although it is easier to correct field dependent. If the ratio $|f_{G3}/L|$ is greater than 0.900 (holding the ratio $|f_{G2}/L|$ fixed) the beam expansion ratio decreases resulting in a more uniformly shaped lens system, however, the angular magnification increases making it more difficult to correct field dependent aberrations although it is easier to correct spherical aberration.

The second group of lens elements G2 includes a subgroup of lens elements $G2_S$ having an overall negative refractive power and includes three lens elements 234, 236, and 238 each having a negative refractive power. The second group of lens elements G2 also includes a lens element 240 having a positive refractive power and having a convex lens surface 12 facing the image plane 112.

The lens subgroup $G2_S$ in conjunction with the lens subgroup $G3_S$ minimizes the Petzval curvature of the overall projection lens system.

The subgroup of lens elements $G2_S$ is disposed approximately at the position in the projection lens system 208 at which the ray trace $A_3$ is closest, indicated at 242, to the optical axis $A_X$ of the projection lens system. The trace $A_3$ represents a light ray emanating from a point on the reticle furthest from the optical axis and at an angle corresponding to the largest angle of view that can be projected through the projection lens system.

The subgroup of lens elements $G3_S$ is disposed approximately at the position in the projection lens system 208 at which a marginal ray $A_4$ emanating from a point on the reticle at the optical axis, indicated at 244, is closest, indicated at 246, to the optical axis $A_X$ while in the third group of lens elements.

The subgroup of lens elements $G4_{S2}$ is disposed at the position at which a marginal ray $A_4$ emanating from a point on the reticle at the optical axis 244 is furthest, indicated at 248, from the optical axis.

The projection lens system 208 satisfies the condition: $|f_{G4S2}/f_{G4}|<4.211$, where $f_{G4S2}$ is the focal length of the subgroup of lens elements $G4_{S2}$ in the fourth group of lens elements G4 and $f_{G4}$ is the focal length of the fourth group of lens elements G4. This condition provides a means of controlling the maximum lens diameter of the fourth group of lens elements G4 and therefore to make it easier to correct and balance the aberrations of the overall projection lens system. Specifically, if the ratio is above 4.211, the diameter of the lens elements in the fourth group of lens elements G4 becomes too large, too bulky, too hard to package, and too costly to manufacture.

The first group of lens elements G1 includes two lens elements 250 and 252 each having a positive refractive power.

The lens element 234 in the subgroup of lens elements $G2_S$ in the second group of lens elements G2 has a concave surface 14 facing the image plane 112. The lens element 238 in the subgroup of lens elements $G2_S$ in the second group of lens elements G2 has a concave surface 17 facing the object plane 106.

The lens element 216 in the subgroup of lens elements $G3_S$ in the third group of lens elements G3 has a concave surface 30 facing the image plane 112. The lens element 220 in the subgroup of lens elements $G3_S$ in the third group of lens elements G3 has a concave surface 33 facing the object plane 106.

The lens element 216 in the subgroup of lens elements $G3_S$ has a shape factor $q_{AF2N}=-1.6966$.

The shape factor q of a lens is expressed by: $q=(r_2+r_1)/(r_2-r_1)$ where $r_1$ is the radius of curvature of the surface on the object side of the lens and $r_2$ is the radius of curvature of the surface on the image side of the lens.

The subgroup of lens elements $G2_S$ and the subgroup of lens elements $G3_S$ are approximately symmetrically disposed on either side of a plane, indicated at 254, that is perpendicular to the optical axis $A_X$ of the projection lens system and is situated between the second group of lens elements G2 and the third group of lens elements G3.

The subgroup of lens elements $G4_{S2}$ in the fourth group of lens elements G4 includes a lens element 228 having a positive refractive power with a stronger convex surface 42 facing the object plane 106, a lens element 230 having a negative refractive power with a stronger concave surface 45 facing the image plane 112, and a lens element 232 having a positive refractive power with a stronger convex surface 46 facing the object plane 106. The lens element 228 has a shape factor $q_{FOCE1P1}=0.5477$, the lens element 230 has a shape factor $q_{FOC21N}=-0.4352$, and the lens element 232 has a shape factor $q_{FOC21P2}=0.772$.

The focal length of the first group of lens elements G1 and the focal length of the fourth group of lens elements satisfy the condition: $1.169<|f_{G1}/f_{G4}|<2.180$. If the ratio is under the lower limit or above the upper limit, the length of the projection lens system becomes too large, causing structural support problems for the projection lens system as a whole.

The projection lens system 208 has a beam expansion ratio (BER) that satisfies the following condition: BER<5.12, where the beam expansion ratio is the ratio of the distance from the optical axis of the marginal ray $A_4$ as it leaves the first group of lens elements to the distance from the optical axis of the marginal ray $A_4$ as it leaves the third group of lens elements. The angular magnification m is the reciprocal of the beam expansion ratio and satisfies the condition: m<0.29. If the beam expansion ratio is greater than 5.12 or if the angular magnification is greater than 0.29, the diameter of the lens elements in the third and fourth groups of lens elements must be large to accommodate the wide beam. This causes the expense of the lens system to increase and causes the weight of the lens system to increase.

The projection lens system 208 has four plano lens surfaces: 34, 35, 38 and 59.

Figure 2B:
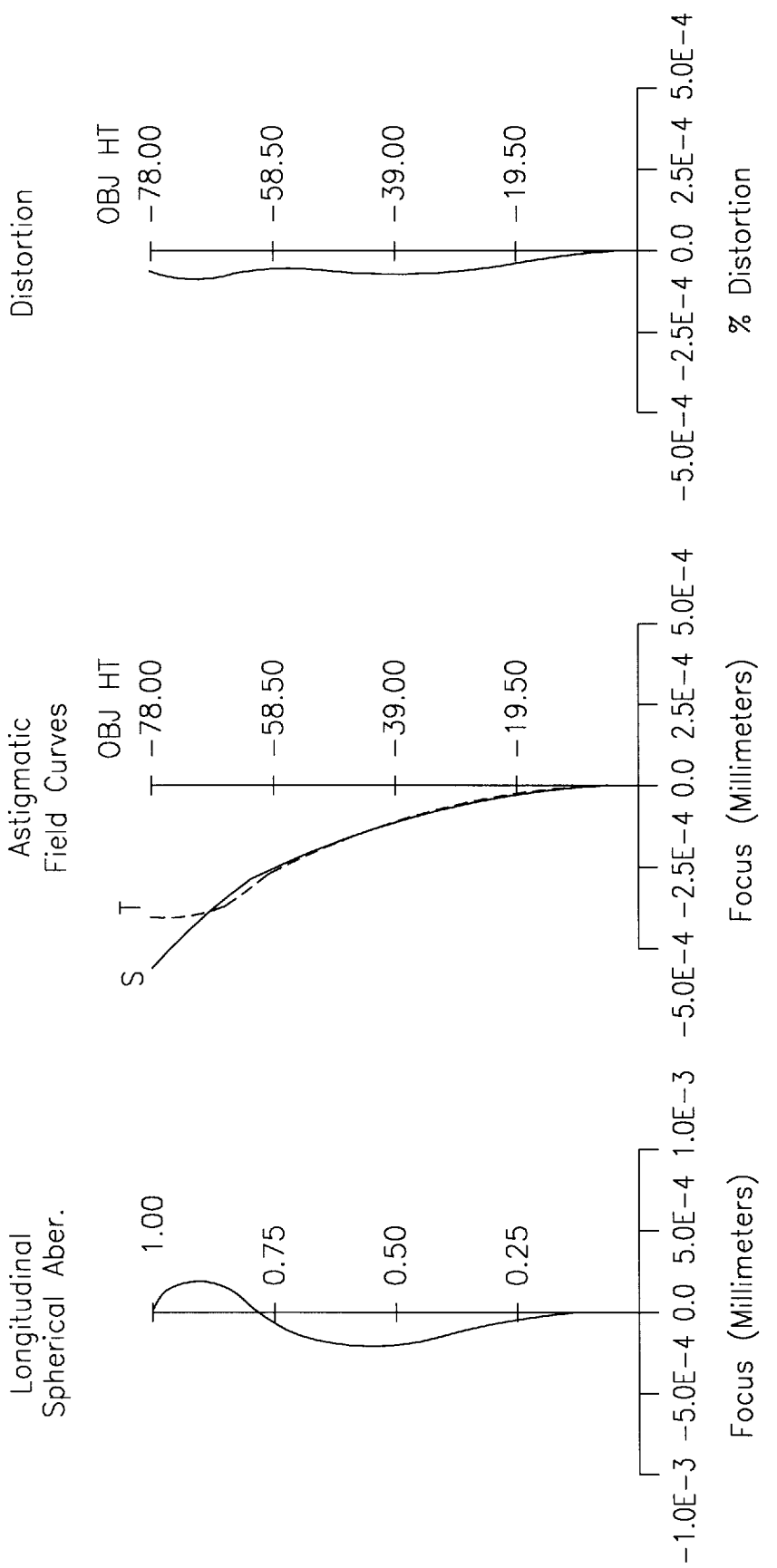
FIG. 2B shows the longitudinal spherical aberration, the astigmatic field curves, and the distortion of the projection lens system shown in FIG. 2A.

FIG. 2B shows the longitudinal spherical aberration, the astigmatic field curves, and the distortion of the projection lens system of the second embodiment shown in FIG. 2A.

Figure 2C:
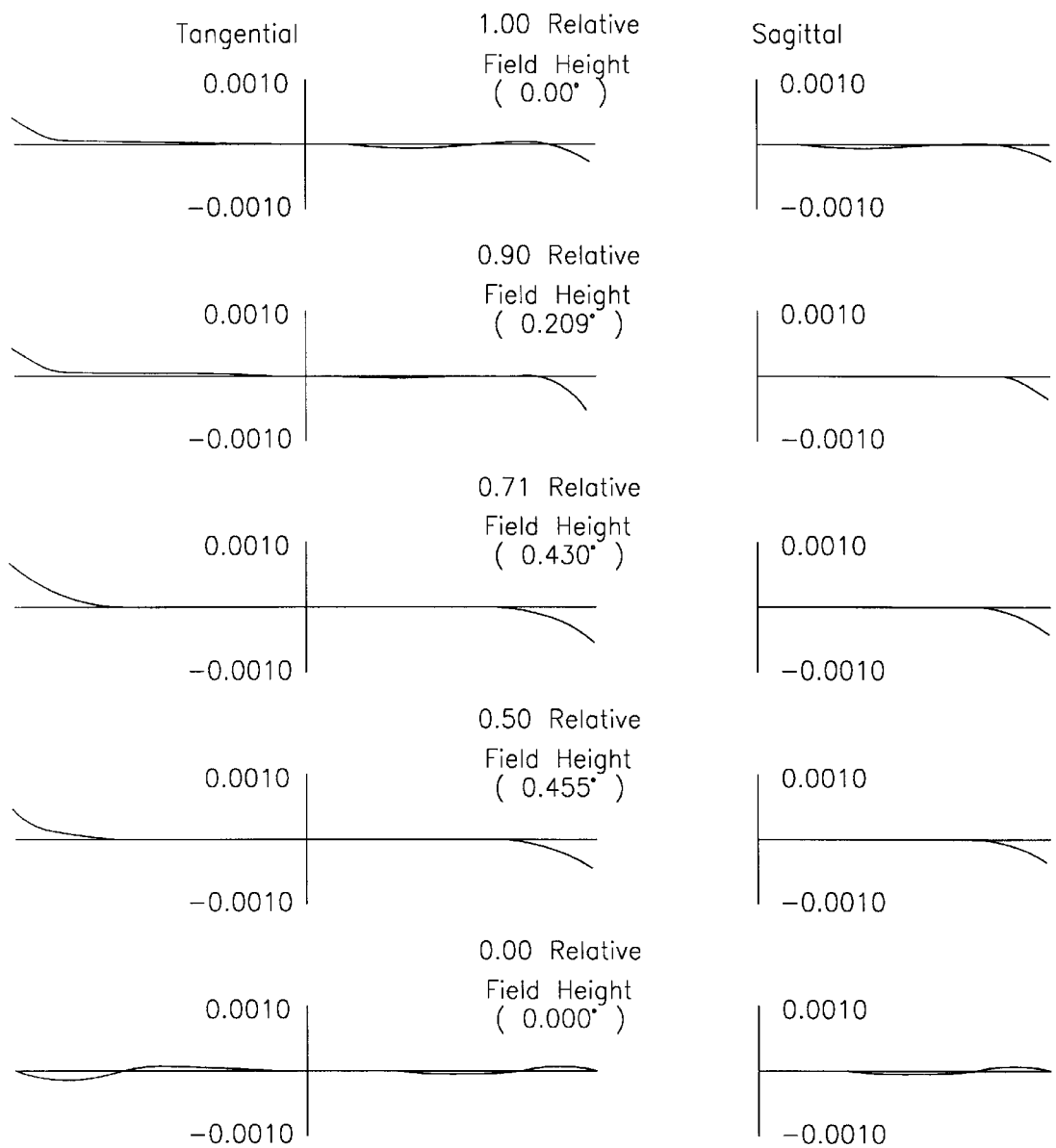
FIG. 2C shows the ray aberrations of the projection lens system shown in FIG. 2A for varying relative field heights all at a wavelength of 365 nanometers.

FIG. 2C shows the ray aberrations of the projection lens system 208 of the second embodiment shown in FIG. 2A for varying field heights at a wavelength of 365 nanometers.

Table 2 below shows the values of specifications for the above second embodiment. The description of the parameters are the same as the description given above in conjunction with Table 1.

TABLE 2

Object plane to first optical surface = 89.000239 mm
Last optical surface to image plane = 19.4999996 mm
$f_{G1}$ = 301.825 mm $f_{G2}$ = -218.374 mm $f_{G3}$ = 719/879 mm
$f_{G4}$ = 150.26 mm $f_{G4A}$ = 138.73 mm $f_{N1}$ = -75.058 mm
$f_{G2S}$ = -50.99 mm $f_{G3S}$ = -56.85 mm $f_{G4S2}$ = 436.07 mm
$q_{AF2N}$ = -1.6966 $q_{FOCE1P1}$ = 0.5477 $q_{FOC21N}$ = -.4352
$q_{FOC21P2}$ = 0.772 L = 1200 mm F = 712.3241 mm F/L = 0.594
NA = 0.63 5x reduction field size on wafer = 22.06 × 22.06 mm or 31.2 mm dia. m = 0.22

| Surface number | Radius of curvature (mm) | axial distance | Refractive index@365.01 nm |
|---|---|---|---|
| OBJ | INFINITY | 89.000239 | |
| 1 | 674.00373 | 32.749962 | 1.612652 |
| 2 | 255.79099 | 15.824292 | |
| 3 | 733.48910 | 29.000000 | 1.615481 |
| 4 | -521.28348 | 0.500000 | |
| 5 | 1634.67363 | 25.707896 | 1.615481 |
| 6 | -430.94046 | 0.500000 | |
| 7 | 590.55768 | 30.000000 | 1.615481 |
| 8 | 1245.94663 | 0.500000 | |
| 9 | 144.74344 | 30.000000 | 1.615481 |
| 10 | 136.69540 | 16.290672 | |
| 11 | 330.77405 | 34.100000 | 1.488581 |
| 12 | -298.94551 | 3.957842 | |
| 13 | 1054.54724 | 22.000000 | 1.615481 |
| 14 | 97.21579 | 25.780456 | |
| 15 | -270.01224 | 13.000000 | 1.612652 |
| 16 | 177.77036 | 28.145297 | |
| 17 | -114.05314 | 24.500000 | 1.612652 |
| 18 | -969.66322 | 13.042605 | |
| 19 | -270.14983 | 27.500000 | 1.612652 |
| 20 | -162.64246 | 2.808063 | |
| 21 | 1033.45954 | 33.000000 | 1.615481 |
| 22 | -313.61572 | 11.340905 | |
| 23 | -717.03864 | 33.000000 | 1.615481 |
| 24 | -278.74616 | 0.500000 | |
| 25 | 282.26630 | 37.645466 | 1.615481 |
| 26 | -1691.07048 | 6.420389 | |
| 27 | 184.25661 | 30.100000 | 1.612652 |
| 28 | 381.79836 | 23.815612 | |
| 29 | 449.16821 | 25.000000 | 1.612652 |
| 30 | 116.03462 | 31.109623 | |
| 31 | -199.58591 | 14.000000 | 1.612652 |
| 32 | 242.26929 | 28.785121 | |

TABLE 2-continued

Object plane to first optical surface = 89.000239 mm
Last optical surface to image plane = 19.4999996 mm
$f_{G1}$ = 301.825 mm $f_{G2}$ = −218.374 mm $f_{G3}$ = 719/879 mm
$f_{G4}$ = 150.26 mm $f_{G4A}$ = 138.73 mm $f_{N1}$ = −75.058 mm
$f_{G2S}$ = −50.99 mm $f_{G3S}$ = −56.85 mm $f_{G4S2}$ = 436.07 mm
$q_{AF2N}$ = −1.6966 $q_{FOCE1P1}$ = 0.5477 $q_{FOC21N}$ = −.4352
$q_{FOC21P2}$ = 0.772 L = 1200 mm F = 712.3241 mm F/L = 0.594
NA = 0.63 5× reduction field size on wafer = 22.06 × 22.06 mm or 31.2 mm dia. m = 0.22

| Surface number | Radius of curvature (mm) | axial distance | Refractive index@365.01 nm |
|---|---|---|---|
| 33 | −118.70226 | 18.000000 | 1.612652 |
| 34 | INFINITY | 2.532340 | |
| 35 | INFINITY | 40.977494 | 1.488581 |
| 36 | −152.71264 | 19.258538 | |
| 37 (AS) | INFINITY | 18.950092 | |
| 38 | INFINITY | 29.218958 | 1.615481 |
| 39 | −337.11944 | 0.500000 | |
| 40 | 587.85643 | 34.200000 | 1.615481 |
| 41 | −770.21041 | 0.500000 | |
| 42 | 266.43515 | 41.845851 | 1.615481 |
| 43 | −911.74841 | 5.455335 | |
| 44 | −514.54003 | 23.000000 | 1.612652 |
| 45 | 202.47615 | 1.366649 | |
| 46 | 195.96477 | 42.917563 | 1.615481 |
| 47 | −1525.42468 | 0.500000 | |
| 48 | 169.46376 | 30.027503 | 1.488581 |
| 49 | 444.15624 | 0.500000 | |
| 50 | 117.25085 | 33.200000 | 1.488581 |
| 51 | 380.84073 | 4.890670 | |
| 52 | 1129.12306 | 22.500000 | 1.612652 |
| 53 | 73.08551 | 5.731970 | |
| 54 | 92.01491 | 25.200000 | 1.488581 |
| 55 | 883.78039 | 0.500000 | |
| 56 | 461.36832 | 15.267985 | 1.612652 |
| 57 | 82.82409 | 0.500000 | |
| 58 | 64.47353 | 23.334712 | 1.612652 |
| 59 | INFINITY | 19.499996 | |
| IMG | INFINITY | 0.000000 | |

Figure 3A:
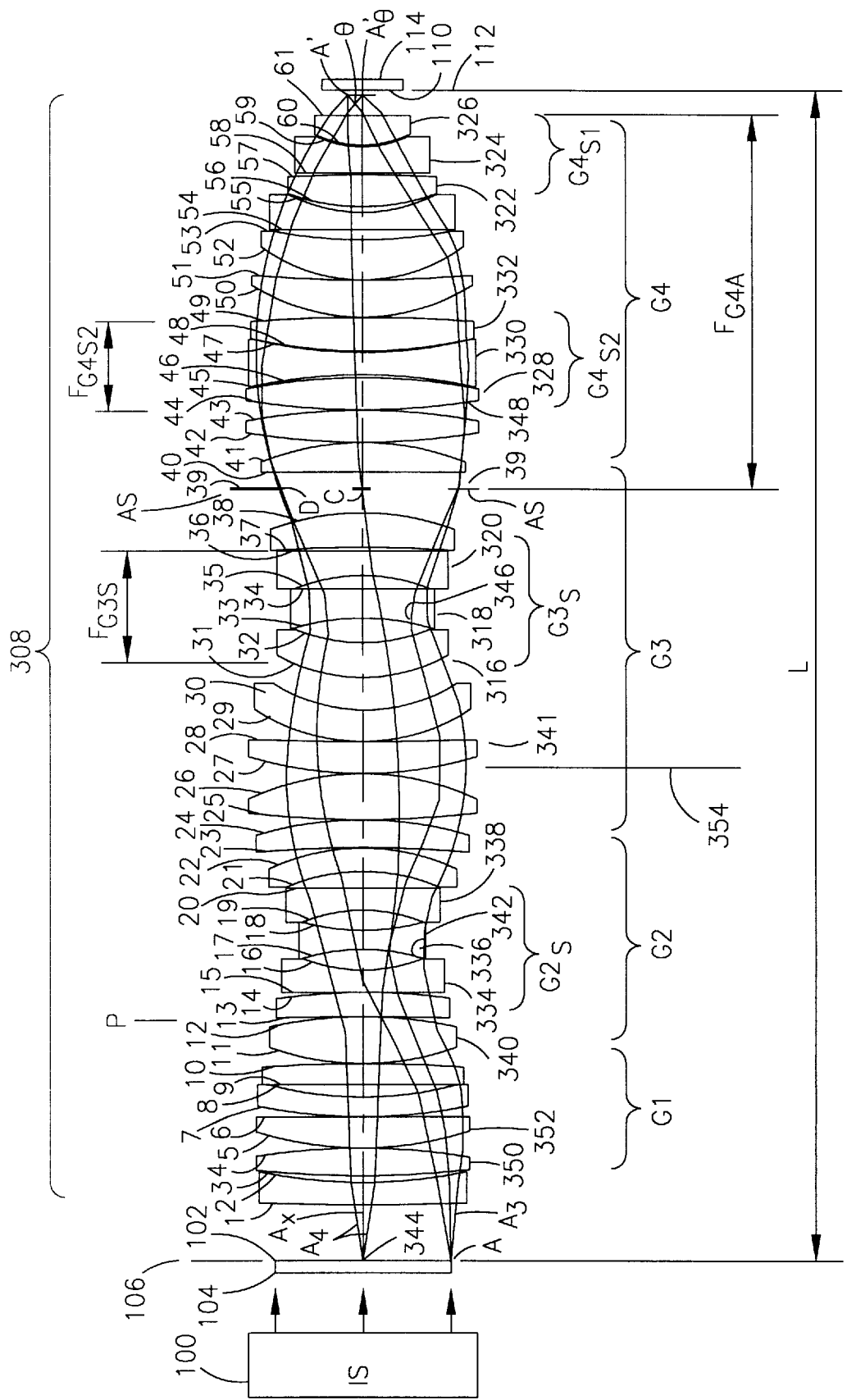
FIG. 3A is a schematic diagram of the projection lens system according to a third embodiment of the present invention.

Referring to FIG. 3A, the projection lens system 308, viewed from the object side, in order of succession, includes a first group of lens elements G1, a second group of lens elements G2, a third group of lens elements G3, and a fourth group of lens elements G4. It is noted that in FIG. 3A there are "distances" indicated, for example, $f_{G4A}$. It is to be understood that these representations do not indicate the focal lengths. These representations only indicate the lens elements that are included in the calculations of focal length.

The third group of lens elements G3 includes a subgroup of lens elements $G3_S$ having an overall negative refractive power, the subgroup of lens elements $G3_S$ having three lens elements 316, 318, and 320, each having a negative refractive power.

The fourth group of lens elements G4 has a first subgroup of lens elements $G4_{S1}$ with a lens element 322 having a positive refractive power, a lens element 324 having a negative refractive power, and a lens element 326 having a positive refractive power. The fourth group of lens elements G4 also has a second subgroup of lens elements $G4_{S2}$ including a lens element 328 having a positive refractive power, a lens element 330 having a negative refractive power, and a lens element 332 having a positive refractive power. An aperture stop AS 39 is disposed between the subgroup $G3_S$ and the subgroup $G4_{S2}$.

The projection lens system 308 satisfies the conditions: $0.073 < |f_{G2}/L| < 0.183$, and $0.228 < |f_{G3}/L| < 0.900$, where $f_{G2}$ is the focal length of the second group of lens elements, $f_{G3}$ is the focal length of the third group of lens elements, and L is the axial distance between the object plane and the image plane. If the above ratios are outside the ranges, it becomes not only difficult to correct the aberrations individually but to balance the aberration correction of the field dependent aberrations (image field curvature, astigmatism, coma, and distortion) together with spherical aberration which is dependent upon the NA of the projection system. The above conditions also affect the uniformity and balance of the maximum diameters of the lens groups in the optical projection system. Specifically, if the ratio $|f_{G2}/L|$ is less than 0.073 (holding the ratio $|f_{G3}/L|$ fixed) the beam expansion ratio decreases resulting in a more uniformly shaped lens system, however, the angular magnification increases making it more difficult to correct field dependent aberrations although it is easier to correct spherical aberration. If the ratio $|f_{G2}/L|$ is greater than 0.183 (holding the ratio $|f_{G3}/L|$ fixed) the beam expansion ratio increases resulting in an irregular shaped lens system and the angular magnification decreases making it more difficult to correct for spherical aberration although it is easier to correct field dependent aberrations. If the ratio $|f_{G3}/L|$ is less than 0.228 (holding the ratio $|f_{G2}/L|$ fixed) the beam expansion ratio increases resulting in an irregular shaped lens system and the angular magnification decreases making it more difficult to correct for spherical aberration although it is easier to correct field dependent. If the ratio $|f_{G3}/L|$ is greater than 0.900 (holding the ratio $|f_{G2}/L|$ fixed) the beam expansion ratio decreases resulting in a more uniformly shaped lens system, however, the angular magnification increases making it more difficult to correct field dependent aberrations although it is easier to correct spherical aberration.

The second group of lens elements G2 includes a subgroup of lens elements $G2_S$ having an overall negative refractive power and includes three lens elements 334, 336, and 338 each having a negative refractive power. The second group of lens elements G2 also includes a lens element 340 having a positive refractive power and having a convex lens surface 14 facing the image plane 112.

The lens subgroup $G2_S$ in conjunction with the lens subgroup $G3_S$ minimizes the Petzval curvature of the overall projection lens system.

The subgroup of lens elements $G2_S$ is disposed approximately at the position in the projection lens system 308 at which the ray trace $A_3$ is closest, indicated at 342, to the optical axis $A_X$ of the projection lens system. The trace $A_3$ represents a light ray emanating from a point on the reticle furthest from the optical axis and at an angle corresponding to the largest angle of view that can be projected through the projection lens system.

The subgroup of lens elements $G3_S$ is disposed approximately at the position in the projection lens system 308 at which a marginal ray $A_4$ emanating from a point on the reticle at the optical axis, indicated at 344, is closest, indicated at 346, to the optical axis $A_X$ while in the third group of lens elements.

The subgroup of lens elements $G4_{S2}$ is disposed at the position at which a marginal ray $A_4$ emanating from a point on the reticle at the optical axis 344 is furthest, indicated at 348, from the optical axis.

The projection lens system 308 satisfies the condition: $|f_{G4S2}/f_{G4}| < 4.211$, where $f_{G4S2}$ is the focal length of the subgroup of lens elements $G4_{S2}$ in the fourth group of lens elements G4 and $f_{G4}$ is the focal length of the fourth group of lens elements G4. This condition provides a means of controlling the maximum lens diameter of the fourth group of lens elements G4 and therefore to make it easier to correct and balance the aberrations of the overall projection lens system. Specifically, if the ratio is above 4.211, the diameter of the lens elements in the fourth group of lens elements G4 becomes too large, too bulky, too hard to package, and too costly to manufacture.

The first group of lens elements G1 includes two lens elements 350 and 352 each having a positive refractive power.

The lens element 334 in the subgroup of lens elements G2$_S$ in the second group of lens elements G2 has a concave surface 16 facing the image plane 112. The lens element 338 in the subgroup of lens elements G2$_S$ in the second group of lens elements G2 has a concave surface 19 facing the object plane 106.

The lens element 316 in the subgroup of lens elements G3$_S$ in the third group of lens elements G3 has a stronger concave surface 32 facing the image plane 112. The lens element 320 in the subgroup of lens elements G3$_S$ in the third group of lens elements G3 has a concave surface 35 facing the object plane 106.

The lens element 316 in the subgroup of lens elements G3$_S$ has a shape factor $q_{AF2N}=-4.7342$.

The shape factor q of a lens is expressed by: $q=(r_2+r_1)/(r_2-r_1)$ where $r_1$ is the radius of curvature of the surface on the object side of the lens and $r_2$ is the radius of curvature of the surface on the image side of the lens.

The subgroup of lens elements G2$_S$ and the subgroup of lens elements G3$_S$ are approximately symmetrically disposed on either side of a plane, indicated at 354, that is perpendicular to the optical axis $A_X$ of the projection lens system and is situated between the second group of lens elements G2 and the third group of lens elements G3.

The subgroup of lens elements G4$_{S2}$ in the fourth group of lens elements G4 includes a lens element 328 having a positive refractive power with a stronger convex surface 44 facing the object plane 106, a lens element 330 having a negative refractive power with a stronger concave surface 46 facing the object plane 106, and a lens element 332 having a positive refractive power with a stronger convex surface 48 facing the object plane 106. The lens element 328 has a shape factor $q_{FOCE1P1}=0.2748$, the lens element 330 has a shape factor $q_{FOC21N}=0.3045$, and the lens element 332 has a shape factor $q_{FOC21P2}=0.453$.

The focal length of the first group of lens elements G1 and the focal length of the fourth group of lens elements satisfy the condition: $1.169<|f_{G1}/f_{G4}|<2.180$. If the ratio is under the lower limit or above the upper limit, the length of the projection lens system becomes too large, causing structural support problems for the projection lens system.

The projection lens system 308 has a beam expansion ratio (BER) that satisfies the following condition: BER<5.12, where the beam expansion ratio is the ratio of the distance from the optical axis of the marginal ray $A_4$ as it leaves the first group of lens elements to the distance from the optical axis of the marginal ray $A_4$ as it leaves the third group of lens elements. The angular magnification m is the reciprocal of the beam expansion ratio and satisfies the condition: m<0.29. If the beam expansion ratio is greater than 5.12 or if the angular magnification is greater than 0.29, the diameter of the lens elements in the third and fourth groups of lens elements must be large to accommodate the wide beam. This causes the expense of the lens system to increase and causes the weight of the lens system to increase.

The projection lens system 308 has one plano lens surface 13.

Figure 3B:
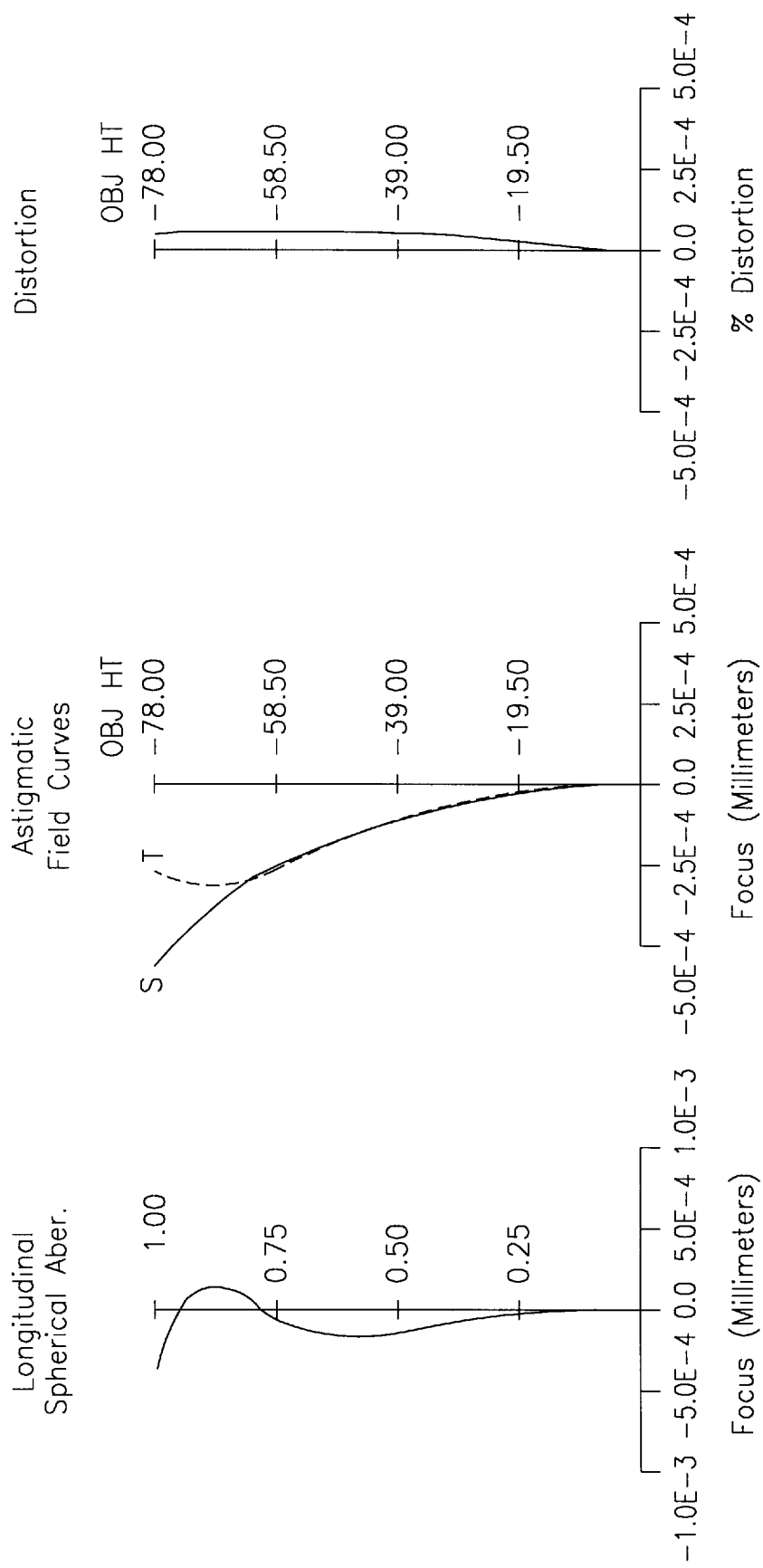
FIG. 3B shows the longitudinal spherical aberration, the astigmatic field curves, and the distortion of the projection lens system shown in FIG. 3A.

FIG. 3B shows the longitudinal spherical aberration, the astigmatic field curves, and the distortion of the projection lens system of the third embodiment shown in FIG. 3A.

Figure 3C:
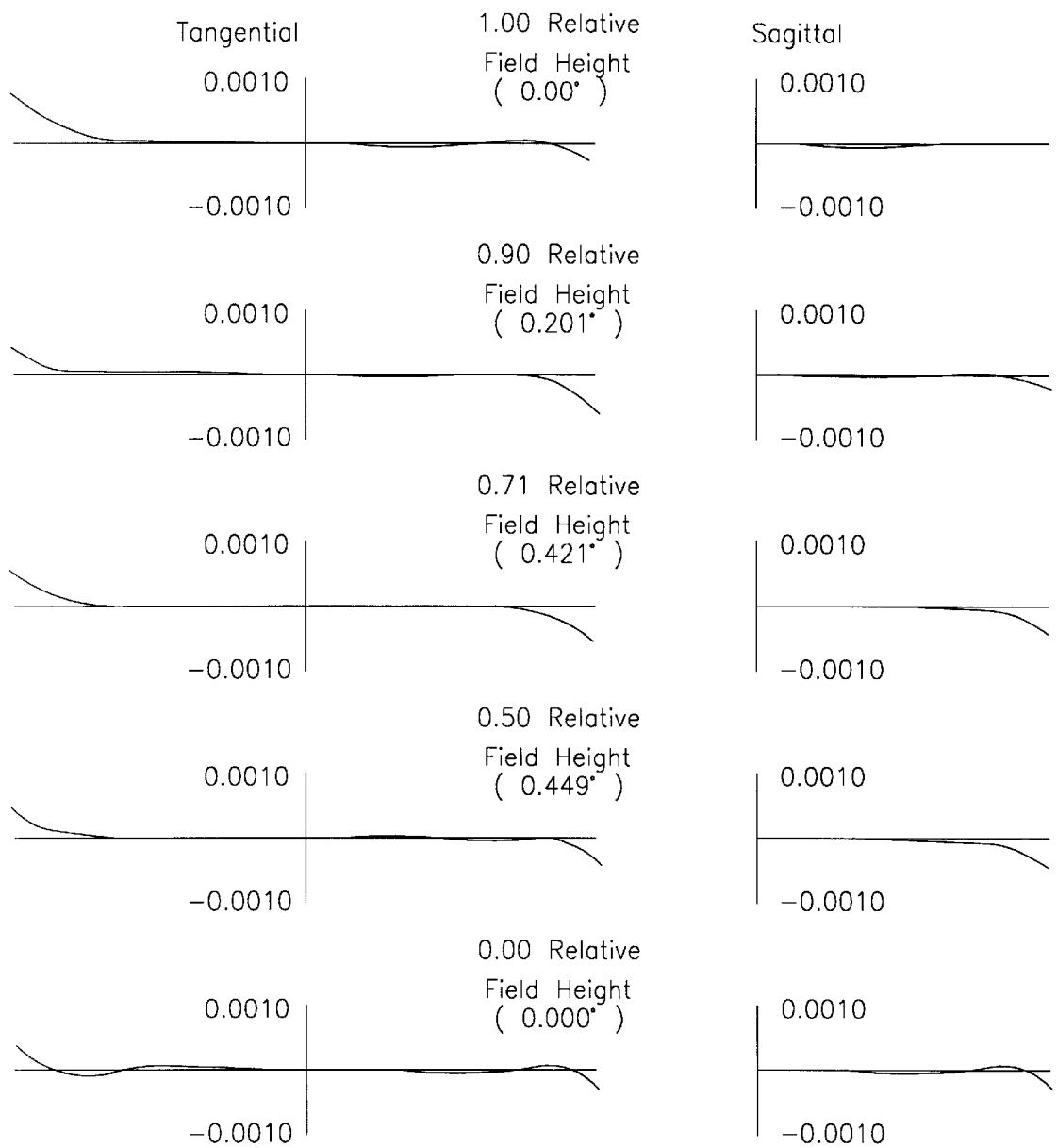
FIG. 3C shows the ray aberrations of the projection lens system shown in FIG. 3A for varying relative field heights all at wavelength of 365 nanometers.

FIG. 3C shows the ray aberrations of the projection lens system 308 of the third embodiment shown in FIG. 3A for varying field heights at a wavelength of 365 nanometers.

Table 3 below shows the values of specifications for the above third embodiment. The description of the parameters are the same as the description given above in conjunction with Table 1.

TABLE 3

Object plane to first optical surface = 80.00014
Last optical surface to image plane = 15.499980
$f_{G1}$ = 181.653 mm $f_{G2}$ = -95.374 mm $f_{G3}$ = 410.763 mm
$f_{G4}$ = 142.605 mm $f_{G4A}$ = 130.17 mm $f_{N1}$ = -53.970 mm
$f_{G2S}$ = -49.63 mm $f_{G3S}$ = -65.76 mm $f_{G4S2}$ = 365.72 mm
$q_{AF2N}$ = -4.7342 $q_{FOCE1P1}$ = 0.2748 $q_{FOC21N}$ = 0.3045
$q_{FOC21P2}$ = 0.453 L = 1100 mm F = 761.3382 mm F/L = 0.692
NA = 0.6 5× reduction field size on wafer = 22.06 × 22.06 mm or 31.2 mm dia. m = 0.22

| Surface number | Radius of curvature (mm) | axial distance | Refractive index@365.01 nm |
|---|---|---|---|
| OBJ | INFINITY | 80.000140 | |
| 1 | 1200.16735 | 20.000000 | 1.612624 |
| 2 | 252.41918 | 13.282155 | |
| 3 | 1104.74961 | 27.351074 | 1.666366 |
| 4 | -365.57759 | 0.500000 | |
| 5 | 219.67445 | 32.940214 | 1.612624 |
| 6 | 5729.73719 | 0.500000 | |
| 7 | 388.77096 | 18.000000 | 1.612624 |
| 8 | 181.66356 | 19.489650 | |
| 9 | 1349.18106 | 18.000000 | 1.612624 |
| 10 | -2044.04086 | 0.500000 | |
| 11 | 198.90454 | 37.815325 | 1.511828 |
| 12 | -459.97146 | 0.500000 | |
| 13 | INFINITY | 18.000000 | 1.580134 |
| 14 | -650.00004 | 0.500000 | |
| 15 | 763.62731 | 20.000000 | 1.627412 |
| 16 | 108.34527 | 22.926117 | |
| 17 | -307.51712 | 20.000000 | 1.666366 |
| 18 | 144.34559 | 26.633043 | |
| 19 | -118.58168 | 21.210283 | 1.579185 |
| 20 | -8538.65481 | 9.508418 | |
| 21 | -265.30059 | 20.866736 | 1.635997 |
| 22 | -165.62349 | 0.500000 | |
| 23 | -1067.67661 | 22.462453 | 1.511828 |
| 24 | -274.49428 | 0.500000 | |
| 25 | 538.06942 | 39.472860 | 1.511828 |
| 26 | -225.30578 | 0.500000 | |
| 27 | 258.18195 | 21.735702 | 1.511828 |
| 28 | 662.58366 | 0.500000 | |
| 29 | 132.66860 | 31.523872 | 1.579185 |
| 30 | 116.89581 | 20.763288 | |
| 31 | 175.02197 | 18.000000 | 1.666366 |
| 32 | 113.97791 | 24.863797 | |
| 33 | -169.15711 | 20.000000 | 1.535754 |
| 34 | 304.15087 | 27.260887 | |
| 35 | -92.35728 | 20.000000 | 1.635997 |
| 36 | -3073.10584 | 1.833528 | |
| 37 | -1151.88372 | 32.916869 | 1.511828 |
| 38 | -132.10553 | 20.972258 | |
| 39 (AS) | INFINITY | 22.125721 | |
| 40 | -2004.64763 | 26.235466 | 1.612624 |
| 41 | -288.59787 | 0.500000 | |
| 42 | 791.53026 | 29.409015 | 1.612624 |
| 43 | -500.61734 | 0.500000 | |
| 44 | 351.48340 | 36.742532 | 1.612624 |
| 45 | -617.89501 | 7.544922 | |
| 46 | -347.22007 | 20.000000 | 1.619287 |
| 47 | 651.25811 | 0.500000 | |
| 48 | 304.69319 | 36.348688 | 1.627412 |
| 49 | -803.84837 | 0.500000 | |
| 50 | 196.85399 | 28.530844 | 1.511828 |
| 51 | 561.63983 | 0.500000 | |
| 52 | 108.36027 | 38.621401 | 1.511828 |

TABLE 3-continued

Object plane to first optical surface = 80.00014
Last optical surface to image plane = 15.499980
$f_{G1}$ = 181.653 mm $f_{G2}$ = -95.374 mm $f_{G3}$ = 410.763 mm
$f_{G4}$ = 142.605 mm $f_{G4A}$ = 130.17 mm $f_{N1}$ = -53.970 mm
$f_{G2S}$ = -49.63 mm $f_{G3S}$ = -65.76 mm $f_{G4S2}$ = 365.72 mm
$q_{AF2N}$ = -4.7342 $q_{FOCE1P1}$ = 0.2748 $q_{FOC21N}$ = 0.3045
$q_{FOC21P2}$ = 0.453 L = 1100 mm F = 761.3382 mm F/L = 0.692
NA = 0.6 5× reduction field size on wafer = 22.06 × 22.06 mm or 31.2 mm dia. m = 0.22

| Surface number | Radius of curvature (mm) | axial distance | Refractive index@365.01 nm |
|---|---|---|---|
| 53 | 410.94509 | 2.669656 | |
| 54 | 631.41884 | 20.000000 | 1.635997 |
| 55 | 67.62530 | 9.572511 | |
| 56 | 105.06548 | 25.956009 | 1.511828 |
| 57 | -554.39834 | 4.262811 | |
| 58 | -449.23764 | 19.592881 | 1.635997 |
| 59 | 79.87513 | 0.500000 | |
| 60 | 59.26629 | 21.558875 | 1.635997 |
| 61 | -2130.86750 | 15.499980 | |
| IMG | INFINITY | 0.000000 | |

Figure 4A:
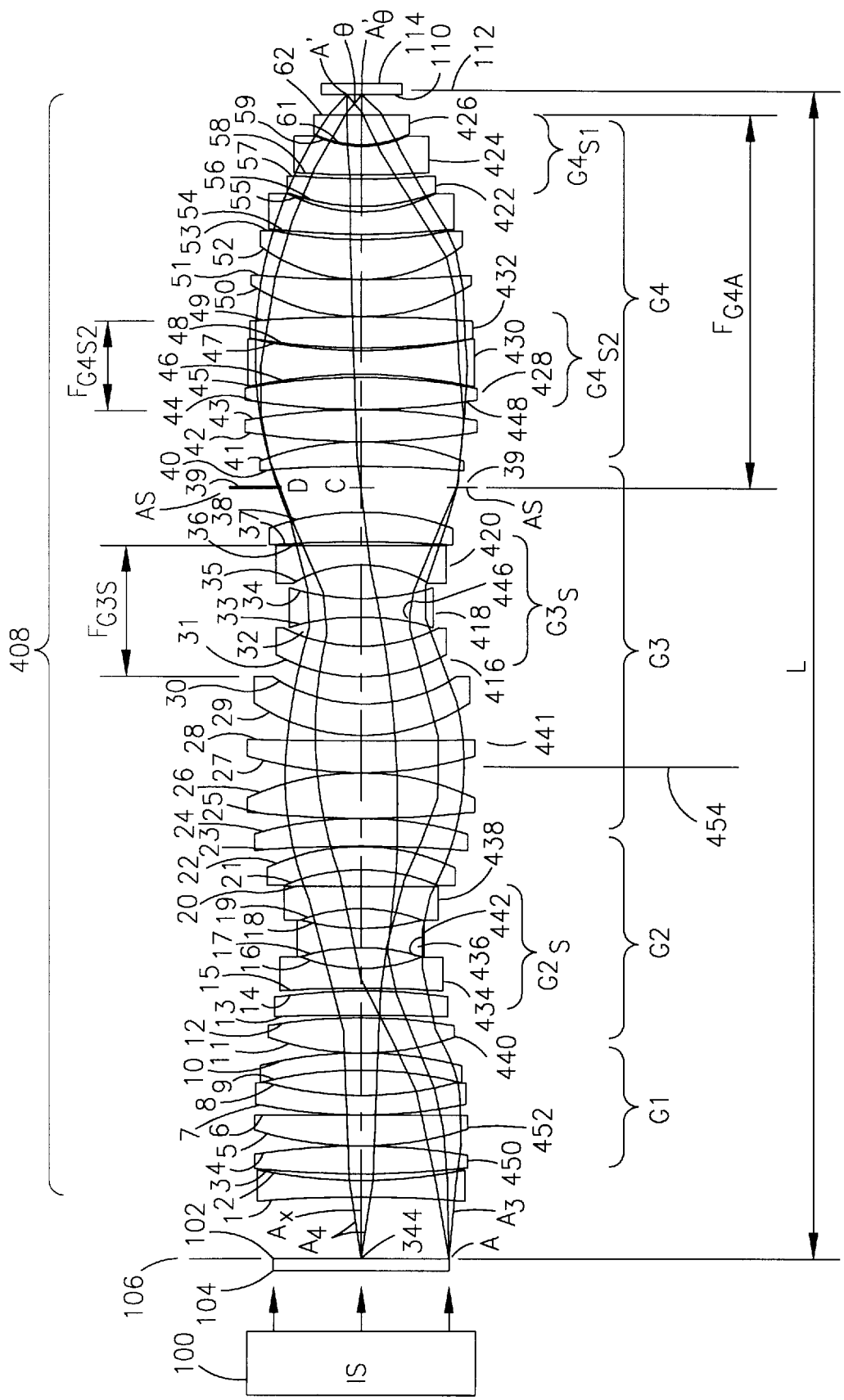
FIG. 4A is a schematic diagram of the projection lens system according to a fourth embodiment of the present invention.

Referring to FIG. 4A, the projection lens system 408, viewed from the object side, in order of succession, includes a first group of lens elements G1 a second group of lens elements G2, a third group of lens elements G3, and a fourth group of lens elements G4. It is noted that in FIG. 4A there are "distances" indicated, for example, $f_{G4A}$. It is to be understood that these representations do not indicate the focal lengths. These representations only indicate the lens elements that are included in the calculations of focal length.

The third group of lens elements G3 includes a subgroup of lens elements $G3_s$ having an overall negative refractive power, the subgroup of lens elements $G3_S$ having three lens elements 416, 418, and 420, each having a negative refractive power. The fourth group of lens elements G4 has a first subgroup of lens elements $G4_{S1}$ with a lens element 422 having a positive refractive power, a lens element 424 having a negative refractive poser, and a lens element 426 having a positive refractive power. The fourth group of lens elements G4 also has a second subgroup of lens elements $G4_{S2}$ including a lens element 428 having a positive refractive power, a lens element 430 having a negative refractive power, and a lens element 432 having a positive refractive power. An aperture stop AS 39 is disposed between the subgroup $G3_S$ and the subgroup $G4_{S2}$.

The projection lens system 408 satisfies the conditions: $0.073 < |f_{G2}/L| < 0.183$, and $0.228 < |f_{G3}/L| < 0.900$, where $f_{G2}$ is the focal length of the second group of lens elements, $f_{G3}$ is the focal length of the third group of lens elements, and L is the axial distance between the object plane and the image plane. If the above ratios are outside the ranges, it becomes not only difficult to correct the aberrations individually but to balance the aberration correction of the field dependent aberrations (image field curvature, astigmatism, coma, and distortion) together with spherical aberration which is dependent upon the NA of the projection system. The above conditions also affect the uniformity and balance of the maximum diameters of the lens groups in the optical projection system. Specifically, if the ratio $|f_{G2}/L|$ is less than 0.073 (holding the ratio $|f_{G3}/L|$ fixed) the beam expansion ratio decreases resulting in a more uniformly shaped lens system, however, the angular magnification increases making it more difficult to correct field dependent aberrations although it is easier to correct spherical aberration. If the ratio $|f_{G2}/L|$ is greater than 0.183 (holding the ratio $|f_{G3}/L|$ fixed) the beam expansion ratio increases resulting in an irregular shaped lens system and the angular magnification decreases making it more difficult to correct for spherical aberration although it is easier to correct field dependent aberrations. If the ratio $|f_{G3}/L|$ is less than 0.228 (holding the ratio $|f_{G2}/L|$ fixed) the beam expansion ratio increases resulting in an irregular shaped lens system and the angular magnification decreases making it more difficult to correct for spherical aberration although it is easier to correct field dependent. If the ratio $|f_{G3}/L|$ is greater than 0.900 (holding the ratio $|f_{G2}/L|$ fixed) the beam expansion ratio decreases resulting in a more uniformly shaped lens system, however, the angular magnification increases making it more difficult to correct field dependent aberrations although it is easier to correct spherical aberration.

The second group of lens elements G2 includes a subgroup of lens elements $G2_S$ having an overall negative refractive power and includes three lens elements 434, 436, and 438 each having a negative refractive power. The second group of lens elements G2 also includes a lens element 440 having a positive refractive power and having a convex lens surface 14 facing the image plane 112.

The lens subgroup $G2_S$ in conjunction with the lens subgroup $G3_S$ minimizes the Petzval curvature of the overall projection lens system.

The subgroup of lens elements $G2_S$ is disposed approximately at the position in the projection lens system 408 at which the ray trace $A_3$ is closest, indicated at 442, to the optical axis $A_X$ of the projection lens system. The trace $A_3$ represents a light ray emanating from a point on the reticle furthest from the optical axis and at an angle corresponding to the largest angle of view that can be projected through the projection lens system.

The subgroup of lens elements $G3_S$ is disposed approximately at the position in the projection lens system 408 at which a marginal ray $A_4$ emanating from a point on the reticle at the optical axis, indicated at 444, is closest, indicated at 446, to the optical axis $A_X$ while in the third group of lens elements.

The subgroup of lens elements $G4_{S2}$ is disposed at the position at which a marginal ray $A_4$ emanating from a point on the reticle at the optical axis 444 is furthest, indicated at 448, from the optical axis.

The projection lens system 408 satisfies the condition: $|f_{G4S2}/f_{G4}| < 4.211$, where $f_{G4S2}$ is the focal length of the subgroup of lens elements $G4_{S2}$ in the fourth group of lens elements G4 and $f_{G4}$ is the focal length of the fourth group of lens elements G4. This condition provides a means of controlling the maximum lens diameter of the fourth group of lens elements G4 and therefore to make it easier to correct and balance the aberrations of the overall projection lens system. Specifically, if the ratio is above 4.211, the diameter of the lens elements in the fourth group of lens elements G4 becomes too large, too bulky, too hard to package, and too costly to manufacture.

The first group of lens elements G1 includes two lens elements 450 and 452 each having a positive refractive power.

The lens element 434 in the subgroup of lens elements $G2_S$ in the second group of lens elements G2 has a concave surface 16 facing the image plane 112. The lens element 438 in the subgroup of lens elements $G2_S$ in the second group of lens elements G2 has a concave surface 19 facing the object plane 106.

The lens element 416 in the subgroup of lens elements $G3_S$ in the third group of lens elements G3 has a concave surface 32 facing the image plane 112. The lens element 420 in the subgroup of lens elements $G3_S$ in the third group of lens elements G3 has a concave surface 35 facing the object plane 106.

The lens element 416 in the subgroup of lens elements $G3_S$ has a shape factor $q_{AF2N}=-4.0704$.

The shape factor q of a lens is expressed by: $q=(r_2+r_1)/(r_2-r_1)$ where $r_1$ is the radius of curvature of the surface on the object side of the lens and $r_2$ is the radius of curvature of the surface on the image side of the lens.

The subgroup of lens elements $G2_S$ and the subgroup of lens elements $G3_S$ are approximately symmetrically disposed on either side of a plane, indicated at 454, that is perpendicular to the optical axis $A_X$ of the projection lens system and is situated between the second group of lens elements G2 and the third group of lens elements G3.

The subgroup of lens elements $G4_{S2}$ in the second focal group of lens elements G4 includes a lens element 428 having a positive refractive power with a stronger convex surface 44 facing the object plane 106, a lens element 430 having a negative refractive power with a stronger concave surface 46 facing the object plane 106, and a lens element 432 having a positive refractive power with a stronger convex surface 48 facing the object plane 106. The lens element 428 has a shape factor $q_{FOCE1P1}=0.2273$, the lens element 430 has a shape factor $q_{FOC21N}=0.2971$, and the lens element 432 has a shape factor $q_{FOC21P2}=0.746$.

The focal length of the first group of lens elements G1 and the focal length of the fourth group of lens elements satisfy the condition: $1.169<|f_{G1}/f_{G4}|<2.180$. If the ratio is under the lower limit or above the upper limit, the length of the projection lens system becomes too large, causing structural support problems.

The projection lens system 408 has a beam expansion ratio (BER) that satisfies the following condition: BER<5.12, where the beam expansion ratio is the ratio of the distance from the optical axis of the marginal ray $A_4$ as it leaves the first group of lens elements to the distance from the optical axis of the marginal ray $A_4$ as it leaves the third group of lens elements. The angular magnification m is the reciprocal of the beam expansion ratio and satisfies the condition: m<0.29. If the beam expansion ratio is greater than 5.12 or if the angular magnification is greater than 0.29, the diameter of the lens elements in the third and fourth groups of lens elements must be large to accommodate the wide beam. This causes the expense of the lens system to increase and causes the weight of the lens system to increase.

Figure 4B:
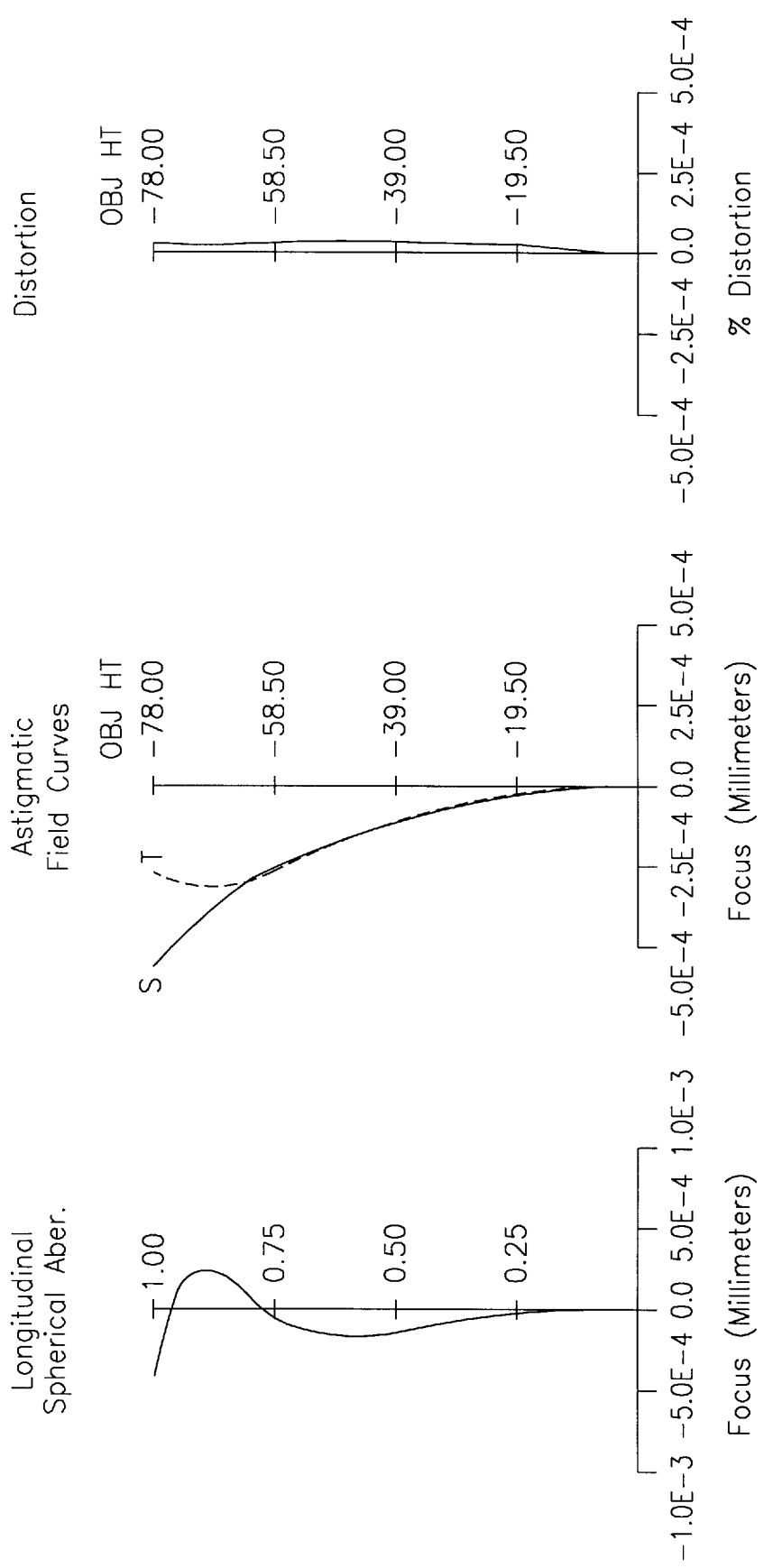
FIG. 4B shows the longitudinal spherical aberration, the astigmatic field curves, and the distortion of the projection lens system shown in FIG. 4A.

FIG. 4B shows the longitudinal spherical aberration, the astigmatic field curves, and the distortion of the projection lens system of the fourth embodiment shown in FIG. 4A.

Figure 4C:
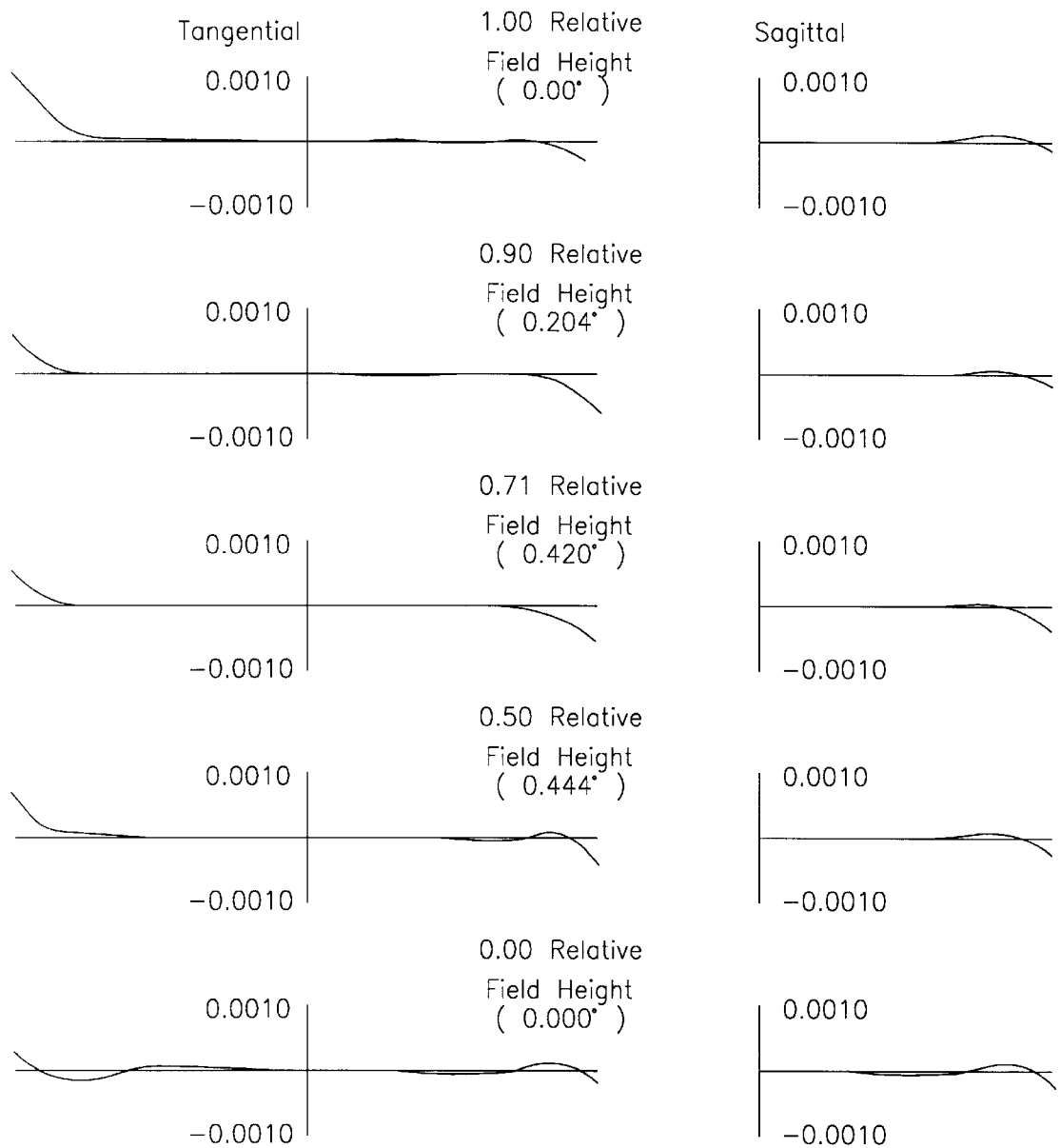
FIG. 4C shows the ray aberrations of the projection lens system shown in FIG. 4A for varying relative field heights all at a wavelength of 365 nanometers.

FIG. 4C shows the ray aberrations of the projection lens system 408 of the fourth embodiment shown in FIG. 4A for varying field heights at a wavelength of 365 nanometers.

Table 4 below shows the values of specifications for the above fourth embodiment. The description of the parameters are the same as the description given above in conjunction with Table 1.

TABLE 4

Object plane to first optical surface = 84.123872 mm
Last optical surface to image plane = 15.603331 mm
$f_{G1}$ = 188.004 mm $f_{G2}$ = −95.248 mm $f_{G3}$ = 383.825 mm
$f_{G4}$ = 160.65 mm $f_{G4A}$ = 149.52 mm $f_{N1}$ = −55.981 mm
$f_{G2S}$ = −52.13 mm $f_{G3S}$ = −75.66 mm $f_{G4S2}$ = 590.80 mm
$q_{AF2N}$ = −4.0704 $q_{FOCE1P1}$ = 0.2273 $q_{FOC21N}$ = 0.2971
$q_{FOC21P2}$ = 0.746 L = 1294.724 mm F = 735.4110 mm F/L = 0.568
NA = 0.65 5× reduction field size on wafer = 22.06 × 22.06 mm or 31.2 mm dia. m = 0.22

| Surface number | Radius of curvature (mm) | axial distance | Refractive index@365.01 nm |
|---|---|---|---|
| OBJ | INFINITY | 84.123872 | |
| 1 | −951.33153 | 20.000000 | 1.612625 |
| 2 | 328.40270 | 11.615595 | |
| 3 | 1109.71657 | 35.693397 | 1.666368 |
| 4 | −327.15949 | 0.500000 | |
| 5 | 261.16408 | 39.751581 | 1.612625 |
| 6 | −1235.04082 | 0.500000 | |
| 7 | 334.00762 | 20.000000 | 1.612625 |
| 8 | 187.75513 | 34.269996 | |
| 9 | −390.03162 | 20.644257 | 1.612625 |
| 10 | −264.25127 | 0.500000 | |
| 11 | 210.27926 | 38.383905 | 1.511828 |
| 12 | −752.13337 | 2.841432 | |
| 13 | −1007.92672 | 22.203955 | 1.580136 |
| 14 | −409.21380 | 0.500000 | |
| 15 | −1001.40074 | 20.000000 | 1.627413 |
| 16 | 128.67693 | 27.504246 | |
| 17 | −270.43314 | 20.090000 | 1.666368 |
| 18 | 187.54226 | 27.126791 | |
| 19 | −143.68015 | 21.210283 | 1.579186 |
| 20 | −5826.42080 | 13.327757 | |
| 21 | −258.21162 | 24.843655 | 1.635999 |
| 22 | −192.18597 | 0.546332 | |
| 23 | −1125.70869 | 29.743117 | 1.627413 |
| 24 | −288.21658 | 0.511031 | |
| 25 | 689.64259 | 50.000000 | 1.627413 |
| 26 | −270.15814 | 1.158059 | |
| 27 | 244.33671 | 36.628192 | 1.627413 |
| 28 | 948.32376 | 3.415170 | |
| 29 | 166.62922 | 31.199204 | 1.579186 |
| 30 | 149.26899 | 20.786147 | |
| 31 | 211.74293 | 21.049728 | 1.666368 |
| 32 | 128.22121 | 35.799281 | |
| 33 | −212.84984 | 20.000000 | 1.535755 |
| 34 | 338.51650 | 41.615473 | |
| 35 | −116.03345 | 20.000000 | 1.635999 |
| 36 | −3592.83679 | 1.426549 | |
| 37 | −1903.69418 | 44.088236 | 1.511828 |
| 38 | −156.59803 | 25.024504 | |
| 39 (AS) | INFINITY | 24.286788 | |
| 40 | −1468.00713 | 30.701222 | 1.612625 |
| 41 | −362.76970 | 1.155016 | |
| 42 | 736.24134 | 37.414984 | 1.612625 |
| 43 | −725.19343 | 0.931636 | |
| 44 | 395.47939 | 46.864994 | 1.612625 |
| 45 | −628.17366 | 6.084888 | |
| 46 | −432.40464 | 20.000000 | 1.619289 |
| 47 | 797.91775 | 0.500000 | |
| 48 | 518.70713 | 32.680034 | 1.627413 |
| 49 | −3569.96470 | 0.500000 | |
| 50 | 200.43793 | 46.062460 | 1.511828 |
| 51 | 2012.07031 | 0.500000 | |
| 52 | 128.67901 | 42.868000 | 1.511828 |
| 53 | 379.05221 | 4.395130 | |
| 54 | 680.66322 | 20.000000 | 1.635999 |
| 55 | 83.53749 | 9.168570 | |
| 56 | 113.32161 | 28.840732 | 1.511828 |
| 57 | 520.44519 | 3.350661 | |
| 58 | 381.05350 | 26.818229 | 1.635999 |
| 59 | 77.51079 | 0.500000 | |
| 60 | 65.17198 | 26.965076 | 1.635999 |
| 61 | 4028.68144 | 15.603331 | |
| IMG | INFINITY | 0.00000 | |

Figure 5A:
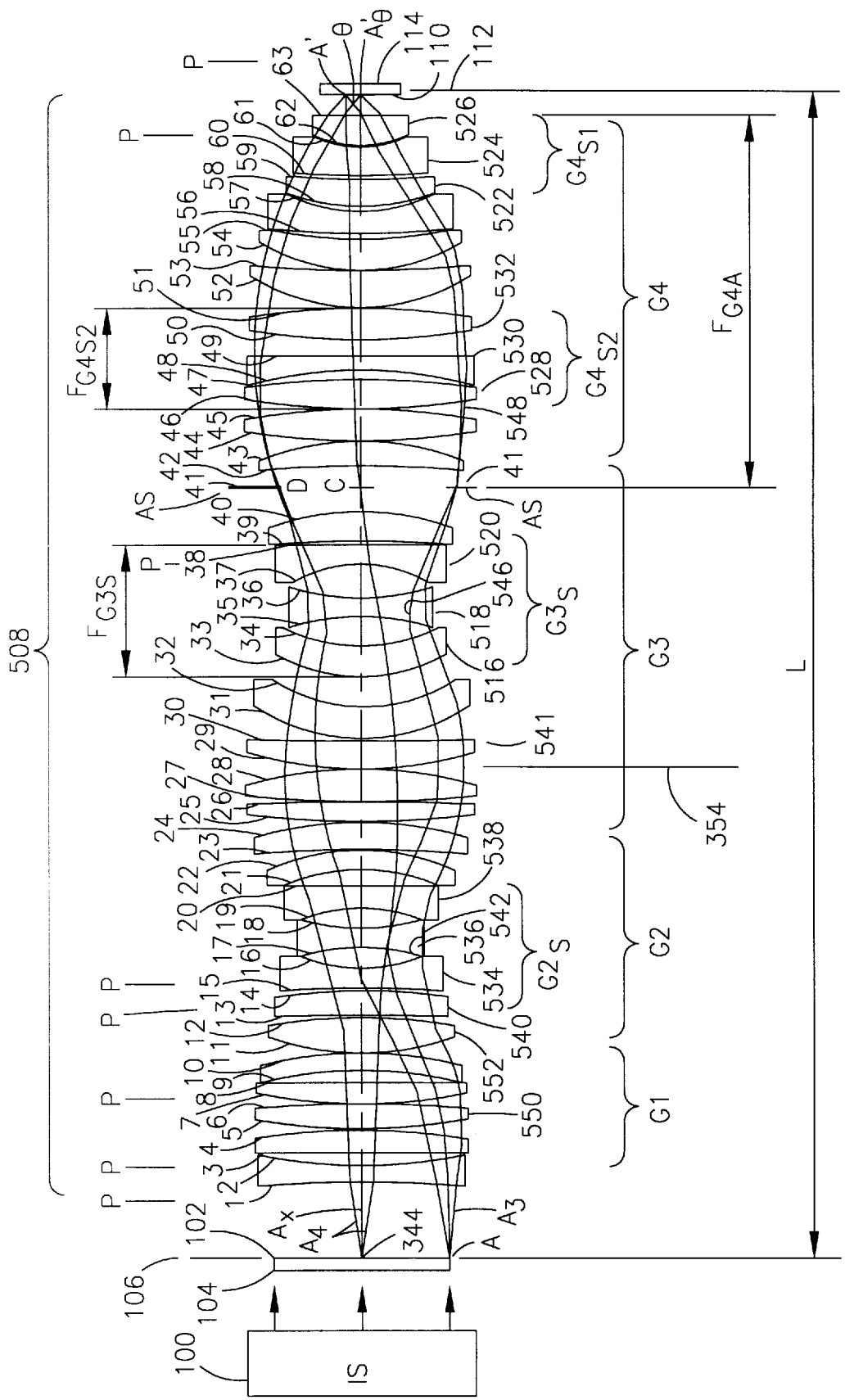
FIG. 5A is a schematic diagram of the projection lens system according to a fifth embodiment of the present invention.

Referring to FIG. 5A, the projection lens system 508, viewed from the object side, in order of succession, includes a first group of lens elements G1, a second group of lens elements G2, a third group of lens elements G3, and a fourth group of lens elements G4. It is noted that in FIG. 5A there are "distances" indicated, for example, $f_{G4A}$. It is to be understood that these representations do not indicate the focal lengths. These representations only indicate the lens elements that are included in the calculations of focal length.

The third group of lens elements G3 includes a subgroup of lens elements $G3_S$ having an overall negative refractive power, the subgroup of lens elements $G3_S$ having three lens elements 516, 518, and 520, each having a negative refractive power. The fourth group of lens elements G4 has a first subgroup of lens elements $G4_{S1}$ with a lens element 522 having a positive refractive power, a lens element 524 having a negative refractive power, and a lens element 526 having a positive refractive power. The fourth group of lens elements G4 also has a second subgroup of lens elements $G4_{S2}$ including a lens element 528 having a positive refractive power, a lens element 530 having a negative refractive power, and a lens element 532 having a positive refractive power. An aperture stop AS 41 is disposed between the subgroup $G3_S$ and the subgroup $G4_{S2}$.

The projection lens system 508 satisfies the conditions: $0.073 < |f_{G2}/L| < 0.183$, and $0.228 < |f_{G3}/L| < 0.900$, where $f_{G2}$ is the focal length of the second group of lens elements, $f_{G3}$ is the focal length of the third group of lens elements, and L is the axial distance between the object plane and the image plane. If the above ratios are outside the ranges, it becomes not only difficult to correct the aberrations individually but to balance the aberration correction of the field dependent aberrations (image field curvature, astigmatism, coma, and distortion) together with spherical aberration which is dependent upon the NA of the projection system. The above conditions also affect the uniformity and balance of the maximum diameters of the lens groups in the optical projection system. Specifically, if the ratio $|f_{G2}/L|$ is less than 0.073 (holding the ratio $|f_{G3}/L|$ fixed) the beam expansion ratio decreases resulting in a more uniformly shaped lens system, however, the angular magnification increases making it more difficult to correct field dependent aberrations although it is easier to correct spherical aberration. If the ratio $|f_{G2}/L|$ is greater than 0.183 (holding the ratio $|f_{G3}/L|$ fixed) the beam expansion ratio increases resulting in an irregular shaped lens system and the angular magnification decreases making it more difficult to correct for spherical aberration although it is easier to correct field dependent aberrations. If the ratio $|f_{G3}/L|$ is less than 0.228 (holding the ratio $|f_{G2}/L|$ fixed) the beam expansion ratio increases resulting in an irregular shaped lens system and the angular magnification decreases making it more difficult to correct for spherical aberration although it is easier to correct field dependent. If the ratio $|f_{G3}/L|$ is greater than 0.900 (holding the ratio $|f_{G2}/L|$ fixed) the beam expansion ratio decreases resulting in a more uniformly shaped lens system, however, the angular magnification increases making it more difficult to correct field dependent aberrations although it is easier to correct spherical aberration.

The second group of lens elements G2 includes a subgroup of lens elements $G2_S$ having an overall negative refractive power and includes three lens elements 534, 536, and 538 each having a negative refractive power. The second group of lens elements G2 also includes a lens element 540 having a positive refractive power and having a convex lens surface 14 facing the image plane 112.

The lens subgroup $G2_S$ in conjunction with the lens subgroup $G3_S$ minimizes the Petzval curvature of the overall projection lens system.

The subgroup of lens elements $G2_S$ is disposed approximately at the position in the projection lens system 508 at which the ray trace $A_3$ is closest, indicated at 542, to the optical axis $A_X$ of the projection lens system. The trace $A_3$ represents a light ray emanating from a point on the reticle furthest from the optical axis and at an angle corresponding to the largest angle of view that can be projected through the projection lens system.

The subgroup of lens elements $G3_S$ is disposed approximately at the position in the projection lens system 508 at which a marginal ray $A_4$ emanating from a point on the reticle at the optical axis, indicated at 544, is closest, indicated at 546, to the optical axis $A_X$ while in the third group of lens elements.

The subgroup of lens elements $G4_{S2}$ is disposed at the position at which a marginal ray $A_4$ emanating from a point on the reticle at the optical axis 544 is furthest, indicated at 548, from the optical axis.

The projection lens system 508 satisfies the condition: $|f_{G4S2}/f_{G4}| < 4.211$, where $f_{G4S2}$ is the focal length of the subgroup of lens elements $G4_{S2}$ in the fourth group of lens elements G4 and $f_{G4}$ is the focal length of the fourth group of lens elements G4. This condition provides a means of controlling the maximum lens diameter of the fourth group of lens elements G4 and therefore to make it easier to correct and balance the aberrations of the overall projection lens system. Specifically, if the ratio is above 4.211, the diameter of the lens elements in the fourth group of lens elements G4 becomes too large, too bulky, too hard to package, and too costly to manufacture.

The first group of lens elements G1 includes two lens elements 550 and 552 each having a positive refractive power.

The lens element 534 in the subgroup of lens elements $G2_S$ in the second group of lens elements G2 has a concave surface 16 facing the image plane 112. The lens element 538 in the subgroup of lens elements $G2_S$ in the second group of lens elements G2 has a concave surface 19 facing the object plane 106.

The lens element 516 in the subgroup of lens elements $G3_S$ in the third group of lens elements G3 has a concave surface 34 facing the image plane 112. The lens element 520 in the subgroup of lens elements $G3_S$ in the third group of lens elements G3 has a concave surface 37 facing the object plane 106.

The lens element 516 in the subgroup of lens elements $G3_S$ has a shape factor $q_{AF2N} = -3.1608$.

The shape factor q of a lens is expressed by: $q = (r_2 + r_1)/(r_2 - r_1)$ where $r_1$ is the radius of curvature of the surface on the object side of the lens and $r_2$ is the radius of curvature of the surface on the image side of the lens.

The subgroup of lens elements $G2_S$ and the subgroup of lens elements $G3_S$ are approximately symmetrically disposed on either side of a plane, indicated at 554, that is perpendicular to the optical axis $A_X$ of the projection lens system and is situated between the second group of lens elements G2 and the third group of lens elements G3.

The subgroup of lens elements $G4_{S2}$ in the second focal group of lens elements G4 includes a lens element 528 having a positive refractive power with a convex surface 46 facing the object plane 106, a lens element 530 having a negative refractive power with a stronger concave surface 48 facing the object plane 106, and a lens element 532 having a positive refractive power with a stronger convex surface 50 facing the object plane 106. The lens element 528 has a shape factor $q_{FOCE1P1}$=0.23595, the lens element 530 has a shape factor $q_{FOC21N}$=0.6371, and the lens element 532 has a shape factor $q_{FOC21P2}$=0.329.

The focal length of the first group of lens elements G1 and the focal length of the fourth group of lens elements satisfy the condition: 1.169<|$f_{G1}/f_{G4}$|<2.180. If the ratio is under the lower limit or above the upper limit, the length of the projection lens system becomes too large, causing structural support problems.

The projection lens system 508 has a beam expansion ratio (BER) that satisfies the following condition: BER<5.12, where the beam expansion ratio is the ratio of the distance from the optical axis of the marginal ray $A_4$ as it leaves the first group of lens elements to the distance from the optical axis of the marginal ray $A_4$ as it leaves the third group of lens elements. The angular magnification m is the reciprocal of the beam expansion ratio and satisfies the condition: m<0.29. If the beam expansion ratio is greater than 5.12 or if the angular magnification is greater than 0.29, the diameter of the lens elements in the third and fourth groups of lens elements must be large to accommodate the wide beam. This causes the expense of the lens system to increase and causes the weight of the lens system to increase.

The projection lens system 508 has eight plano lens surfaces: 1, 3, 8, 13, 15, 38, 60, and 63.

Figure 5B:
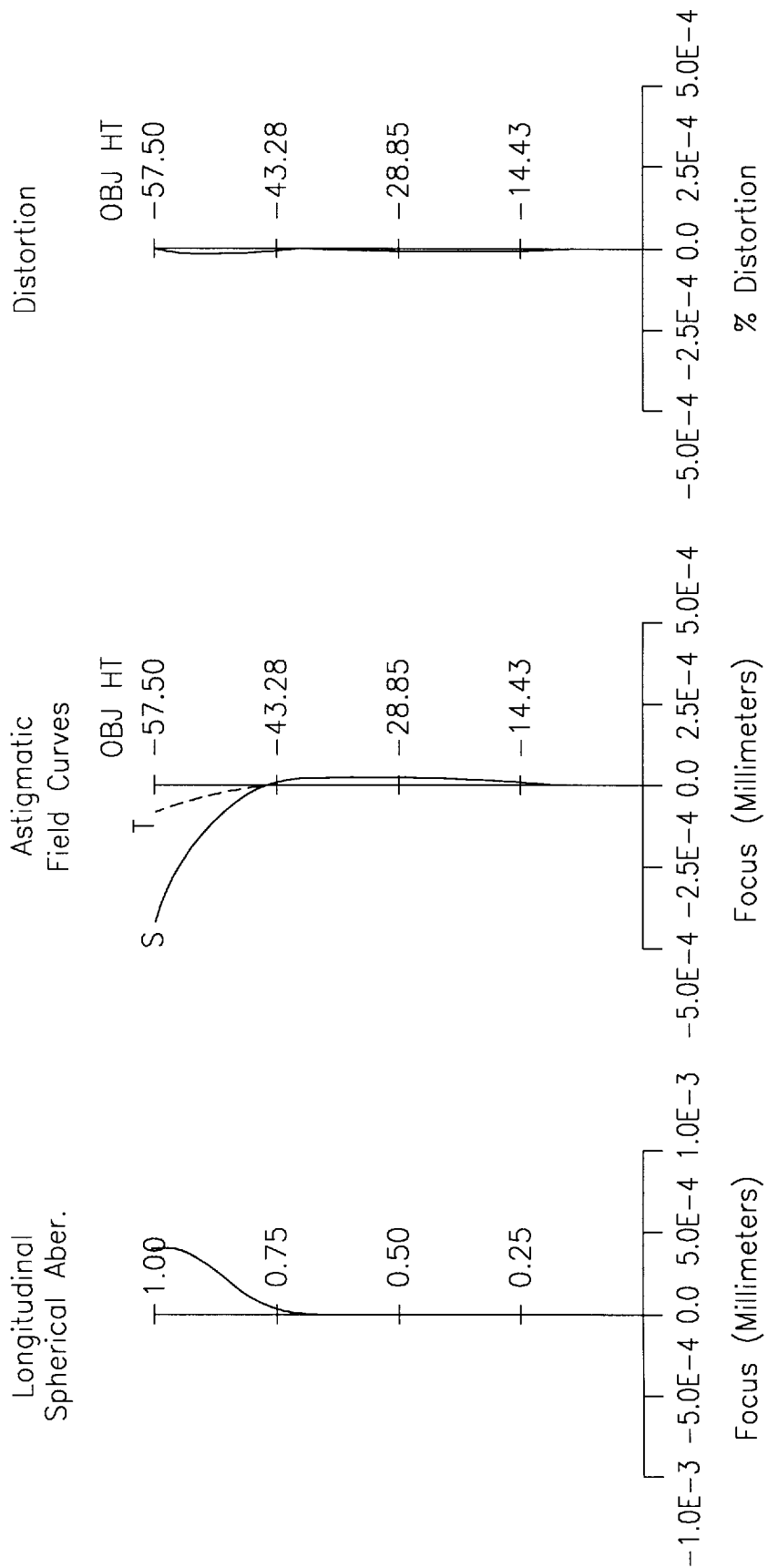
FIG. 5B shows the longitudinal spherical aberration, the astigmatic field curves, and the distortion of the projection lens system shown in FIG. 5A.

FIG. 5B shows the longitudinal spherical aberration, the astigmatic field curves, and the distortion of the projection lens system of the seventh embodiment shown in FIG. 5A.

Figure 5C:
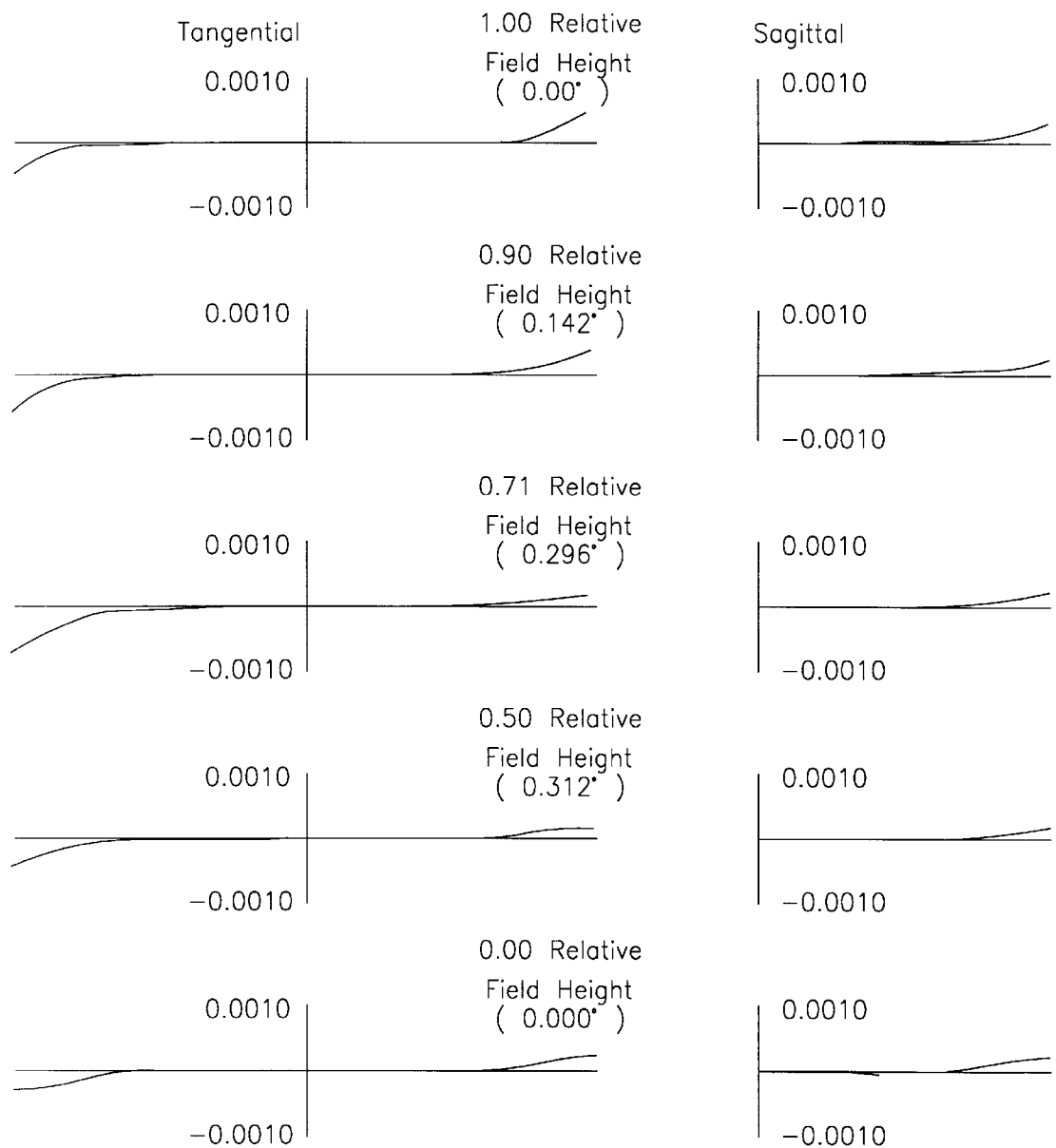
FIG. 5C shows the ray aberrations of the projection lens system shown in FIG. 5A for varying relative field heights all at a wavelength of 365 nanometers.

FIG. 5C shows the ray aberrations of the projection lens system 508 of the seventh embodiment shown in FIG. 5A for varying field heights at a wavelength of 365 nanometers.

Table 5 below shows the values of specifications for the above fifth embodiment. The description of the parameters are the same as the description given above in conjunction with Table 1.

TABLE 5

Object plane to first optical surface = 92.999880 mm
Last optical surface to image plane = 14.999853 mm
$f_{G1}$ = 161.45 mm $f_{G2}$ = −146.495 mm $f_{G3}$ = 976.084 mm
$f_{G4}$ = 148.66 mm $f_{G4A}$ = 134.55 mm $f_{N1}$ = −56.425
$f_{G2S}$ = −48.668 mm $f_{G3S}$ = −60.3 mm $f_{G4S2}$ = 364.58 mm
$q_{AF2N}$ = −3.1608 $q_{FOCE1P1}$ = 0.23595 $q_{FOC21N}$ = 0.6371
$q_{GOV21P2}$ = 0.329 L = 1088 mm F = 933.3144 mm F/L = 0.858
NA = 0.60 4× reduction field size on wafer = 20.4 × 20.4 mm or 28.85 mm dia. m = 0.26

| Surface number | Radius of curvature (mm) | axial distance | Refractive index@365.01 nm |
|---|---|---|---|
| OBJ | INFINITY | 92.999880 | |
| 1 | INFINITY | 15.000000 | 1.612625 |
| 2 | 237.71526 | 12.418693 | |
| 3 | INFINITY | 24.988606 | 1.666368 |
| 4 | −301.53122 | 0.500000 | |
| 5 | 868.61046 | 16.234336 | 1.612625 |
| 6 | −1360.67690 | 0.500000 | |
| 7 | 385.49280 | 19.051911 | 1.612625 |
| 8 | INFINITY | 8.162747 | |
| 9 | −451.61340 | 15.000000 | 1.612625 |
| 10 | −311.09309 | 0.500000 | |
| 11 | 235.39758 | 35.487889 | 1.511828 |
| 12 | −619.46851 | 6.806746 | |
| 13 | INFINITY | 23.646479 | 1.580136 |
| 14 | −343.90232 | 0.500000 | |
| 15 | INFINITY | 15.000000 | 1.627413 |
| 16 | 114.63393 | 21.449272 | |
| 17 | −280.61199 | 15.000000 | 1.666368 |
| 18 | 152.79420 | 26.182700 | |

TABLE 5-continued

Object plane to first optical surface = 92.999880 mm
Last optical surface to image plane = 14.999853 mm
$f_{G1}$ = 161.45 mm $f_{G2}$ = −146.495 mm $f_{G3}$ = 976.084 mm
$f_{G4}$ = 148.66 mm $f_{G4A}$ = 134.55 mm $f_{N1}$ = −56.425
$f_{G2S}$ = −48.668 mm $f_{G3S}$ = −60.3 mm $f_{G4S2}$ = 364.58 mm
$q_{AF2N}$ = −3.1608 $q_{FOCE1P1}$ = 0.23595 $q_{FOC21N}$ = 0.6371
$q_{GOV21P2}$ = 0.329 L = 1088 mm F = 933.3144 mm F/L = 0.858
NA = 0.60 4× reduction field size on wafer = 20.4 × 20.4 mm or 28.85 mm dia. m = 0.26

| Surface number | Radius of curvature (mm) | axial distance | Refractive index@365.01 nm |
|---|---|---|---|
| 19 | −116.18630 | 18.493614 | 1.579186 |
| 20 | −2323.46801 | 9.154203 | |
| 21 | −252.49824 | 20.368378 | 1.635999 |
| 22 | −189.75526 | 0.500000 | |
| 23 | −612.48512 | 23.879108 | 1.627413 |
| 24 | −198.01282 | 0.500000 | |
| 25 | 945.47042 | 19.404518 | 1.627413 |
| 26 | −900.86879 | 0.500000 | |
| 27 | 1025.23585 | 32.000616 | 1.627413 |
| 28 | −268.99841 | 0.500000 | |
| 29 | 269.68643 | 22.960847 | 1.627413 |
| 30 | 483.48088 | 0.781933 | |
| 31 | 127.62096 | 32.565548 | 1.579186 |
| 32 | 122.10278 | 23.643884 | |
| 33 | 214.86408 | 20.021050 | 1.666368 |
| 34 | 111.58487 | 30.817116 | |
| 35 | −140.79037 | 15.000000 | 1.535755 |
| 36 | 340.38842 | 25.178695 | |
| 37 | −102.17268 | 15.000000 | 1.635999 |
| 38 | INFINITY | 1.665582 | |
| 39 | 1986.69296 | 35.455358 | 1.511828 |
| 40 | −139.26401 | 15.124660 | |
| 41 (AS) | INFINITY | 21.760185 | |
| 42 | −646.16452 | 25.226605 | 1.613625 |
| 43 | −218.52219 | 0.500000 | |
| 44 | 444.51976 | 26.923728 | 1.612625 |
| 45 | −1144.12267 | 0.500000 | |
| 46 | 412.10911 | 31.608519 | 1.612625 |
| 47 | −666.64143 | 9.776462 | |
| 48 | −317.37609 | 15.000000 | 1.619289 |
| 49 | 1431.67986 | 14.924069 | |
| 50 | 334.01367 | 35.016253 | 1.627413 |
| 51 | −661.71392 | 0.500000 | |
| 52 | 160.13675 | 31.883136 | 1.511828 |
| 53 | 503.68413 | 0.500000 | |
| 54 | 124.53437 | 31.320164 | 1.511828 |
| 55 | 370.75353 | 5.082640 | |
| 56 | 1089.69531 | 20.406667 | 1.635999 |
| 57 | 77.41066 | 9.050057 | |
| 58 | 125.43293 | 26.761522 | 1.511828 |
| 59 | −1439.22153 | 3.078811 | |
| 60 | INFINITY | 25.948117 | 1.635999 |
| 61 | 75.98610 | 0.767338 | |
| 62 | 59.76587 | 23.521360 | 1.635999 |
| 63 | INFINITY | 14.999853 | |
| IMG | INFINITY | 0.000000 | |

As those skilled in the art of projection optical systems will readily appreciate, numerous substitutions, modifications and additions may be made to the above design without departing from the spirit and scope of the present invention. It is intended that all such substitutions, modifications, and additions fall within the scope of this invention which is best defined by the claims appended below.

What is claimed is:

1. A projection exposure apparatus for transferring a pattern on a reticle onto a substrate, the apparatus comprising:

a support for holding a reticle in an object plane;

a support for holding a substrate in an image plane;

an illuminating system for illuminating a pattern on the reticle;

a projection lens system for projecting an image of the pattern on the reticle onto the substrate;

wherein the projection lens system comprises in order from the object plane to the image plane:
a first group of lens elements;
a second group of lens elements;
a third group of lens elements; and
a fourth group of lens elements, wherein the third group of lens elements includes a subgroup of lens elements having a negative refractive power, the subgroup of lens elements including at least two lens elements each having a negative refractive power;

the fourth group of lens elements includes a first subgroup of lens elements which includes from the object plane side to the image plane side, a lens element having a positive refractive power, a lens element having a negative refractive power, and a lens element having a positive refractive power;

the fourth group of lens elements further includes a second subgroup of lens elements which includes from the object plane side to the image plane side, a lens element having a positive refractive power, a lens element having a negative refractive power, and a lens element having a positive refractive power; and an aperture stop disposed between the subgroup of lens elements having a negative refractive power in the third group of lens elements and the second subgroup of lens elements in the fourth group of lens elements; and wherein the projection lens system satisfies the conditions:

$$0.073 < |f_{G2}/L| < 0.183$$

and $$0.228 < |f_{G3}/L| < 0.900,$$

where $f_{G2}$ is the focal length of the second group of lens elements, $f_{G3}$ is the focal length of the third group of lens elements, and L is the axial distance between the object plane and the image plane.

2. The projection exposure apparatus of claim 1, wherein the second group of lens elements includes:
a subgroup of lens elements having a negative refractive power which includes at least three lens elements each having a negative refractive power; and
at least one lens element having a positive refractive power and having a convex lens surface facing the image plane.

3. The projection exposure apparatus of claim 2, wherein the subgroup of lens elements having a negative refractive power in the second group of lens elements is disposed approximately at the position at which a ray emanating from a point on the reticle furthest from the optical axis at an angle corresponding to the largest angle of view is closest to an optical axis of the projection exposure apparatus during the projection of the ray through the projection lens system.

4. The projection exposure apparatus of claim 1, wherein the subgroup of lens elements having a negative refractive power in the third group of lens elements is disposed approximately at the position at which a marginal ray emanating from the reticle at the optical axis is closest to the optical axis during the projection of the marginal ray through the third group of lens elements of the projection lens system.

5. The projection exposure apparatus of claim 1, wherein the second subgroup of lens elements in the fourth group of lens elements is disposed at the position at which a marginal ray emanating from the reticle at the optical axis is furthest from the optical axis during the projection of the marginal ray through the projection lens system.

6. The projection exposure apparatus of claim 1, wherein the projection lens system satisfies the condition:

$$|f_{G4S2}/f_{G4}| < 4.211,$$

where $f_{G4S2}$ is the focal length of the second subgroup of lens elements in the fourth group of lens elements and $f_{G4}$ is the focal length of the fourth group of lens elements.

7. The projection exposure apparatus of claim 2, wherein the subgroup of lens elements having a negative refractive power in the second group of lens elements includes:
a lens element having a negative refractive power disposed closest to the object plane and having a stronger concave surface facing the image plane; and
a lens element having a negative refractive power disposed closest to the image plane and having a stronger concave surface facing the object plane.

8. The projection exposure apparatus of claim 1, wherein the subgroup of lens elements having a negative refractive power in the third group of lens elements includes:
a lens element disposed closest to the object plane and having a stronger concave surface facing the image plane; and
a lens element disposed closest to the image plane and having a stronger concave surface facing the object plane.

9. The projection exposure apparatus of claim 2, wherein the subgroup of lens elements having a negative refractive power in the second group of lens elements and the subgroup of lens elements having a negative refractive power in the third group of lens elements are disposed approximately symmetrically with respect to a plane which is perpendicular to an optical axis of the projection lens system wherein the plane is situated between the second group of lens elements and the third group of lens elements.

10. The projection exposure apparatus of claim 1, wherein the second subgroup of lens elements in the fourth group of lens elements includes, in order from the object plane side to the image plane side, a lens element having a positive refractive power with a stronger convex surface facing the object plane, a lens element having a negative refractive power, and a lens element having a positive refractive power with a stronger convex surface facing the object plane.

11. The projection exposure apparatus of claim 1, wherein the projection lens system satisfies the condition:

$$1.169 < |f_{G1}/f_{G4}| < 2.180,$$

where $f_{G1}$ is the focal length of the first group of lens elements and $f_{G4}$ is the focal length of the fourth group of lens elements.

12. The projection exposure apparatus of claim 1, wherein the projection lens system satisfies the condition: m<0.29, where m is the angular magnification measured from the first group of lens elements to the third group of lens elements.

13. A method of transferring a pattern on a reticle onto a substrate, the method comprising:
illuminating a pattern on a reticle;
projecting the pattern through a projection lens system onto a substrate; wherein projecting the pattern through a projection lens system includes:
projecting the pattern through a first group of lens elements;

projecting the pattern through a second group of lens elements;

projecting the pattern through a third group of lens elements including a subgroup of lens elements having a negative refractive power, the subgroup of lens elements including at least two lens elements each having a negative refractive power; and projecting the pattern through a fourth group of lens elements including a first subgroup of elements which includes from the object plane side to the image plane side, a lens element having a positive refractive power, a lens element having a negative refractive power, and a lens element having a positive refractive power and including a second subgroup of lens elements which includes from the object plane side to the image plane side, a lens element having a positive refractive power, a lens element having a negative refractive power, and a lens element having a positive refractive power; and projecting the pattern through an aperture stop disposed between the subgroup of lens elements having a negative refractive power in the third group of lens elements and the second subgroup of lens elements in the fourth group of lens elements; and wherein the projection lens system satisfies the conditions:

$$0.073 < |f_{G2}/L| < 0.183$$

and $$0.228 < |f_{G3}/L| < 0.900,$$

where $f_{G2}$ is the focal length of the second group of lens elements, $f_{G3}$ is the focal length of the third group of lens elements, and L is the axial distance between the object plane and the image plane.

14. The method of claim 13, wherein projecting the pattern through the second group of lens elements includes:

projecting the pattern through a subgroup of lens elements in the second group of lens elements having a negative refractive power wherein the subgroup of lens elements includes at least three lens elements each having a negative refractive power;

and at least one lens element in the second group of lens elements having a positive refractive power and having a convex lens surface facing the image plane.

15. The method of claim 14, wherein projecting the pattern through a lens system includes projecting the pattern through the subgroup of lens elements having a negative refractive power in the second group of lens elements wherein the subgroup of lens elements is disposed approximately at the position at which a ray emanating from a point on the reticle furthest from the optical axis at an angle corresponding to the largest angle of view is closest to an optical axis of the projection exposure apparatus during the projection of the ray through the projection lens system.

16. The method of claim 13, wherein projecting the pattern through a lens system includes projecting the pattern through the subgroup of lens elements having a negative refractive power in the third group of lens element wherein the subgroup of lens elements is disposed approximately at the position at which a marginal ray emanating from the reticle at the optical axis is closest to the optical axis during the projection of the marginal ray through the third group of lens elements of the projection lens system.

17. The method of claim 13, wherein projecting the pattern through a lens system includes projecting the pattern through the second subgroup of lens elements in the fourth group of lens elements wherein the fourth group of lens elements is disposed at the position at which a marginal ray emanating from the reticle at the optical axis is furthest from the optical axis during the projection of the marginal ray through the projection lens system.

18. The method of claim 13, wherein projecting the pattern through a lens system includes projecting the pattern through a lens system which satisfies the condition:

$$|f_{G4S2}/f_{G4}| < 4.211,$$

where $f_{G4S2}$ is the focal length of the second subgroup of lens elements in the fourth group of lens elements and $f_{G4}$ is the focal length of the fourth group of lens elements.

19. The method of claim 13, wherein projecting the pattern through a lens system includes projecting the pattern through the first group of lens elements which includes at least two lens elements each having a positive refractive power.

20. The method of claim 13, wherein projecting the pattern through a lens system includes projecting the pattern through the subgroup of lens elements having a negative refractive power in the third group of lens which includes:

a lens element having a negative refractive power disposed closest to the object plane and having a stronger concave surface facing the image plane; and a lens element having a negative refractive power disposed closest to the image plane and having a stronger concave surface facing the object plane.

21. The method of claim 13, wherein projecting the pattern through a lens system includes projecting the pattern through the subgroup of lens elements having a negative refractive power in the third group of lens elements which includes:

a lens element disposed closest to the object plane and having a stronger concave surface facing the image plane; and a lens element disposed closest to the image plane and having a stronger concave surface facing the object plane.

22. The method of claim 13, wherein projecting the pattern through a lens system includes projecting the pattern through the subgroup of lens elements having a negative refractive power in the second group of lens elements and the subgroup of lens elements having a negative refractive power in the third group of lens elements which are disposed approximately symmetrically with respect to a plane which is perpendicular to an optical axis of the projection lens system wherein the plane is situation between the second group of lens elements and the third group of lens elements.

23. The method of claim 13, wherein projecting the pattern through a lens system includes projecting the pattern through the second subgroup of lens elements in the fourth group of lens elements which includes in order from the object plane side to the image plane side, a lens element having a positive refractive power with a stronger convex surface facing the object plane, a lens element having a negative refractive power, and a lens element having a positive refractive power with a stronger convex surface facing the object plane.

24. The method of claim 13, wherein projecting the pattern through the projection lens system includes projecting the pattern through a lens system that satisfies the condition:

$$1.169 < f_{G1}/f_{G4} < 2.180,$$

where $f_{G1}$ is the focal length of the first group of lens elements and $f_{G4}$ is the focal length of the fourth group of lens elements.

25. The method of claim 13, wherein projecting the pattern through the projection lens system includes projecting the pattern through a lens system that satisfies the condition:

$$m<0.29,$$

where m is the angular magnification measured from the first group of lens elements to the third group of lens elements.

* * * * *